United States Patent
Holmgren et al.

(10) Patent No.: US 11,157,069 B2
(45) Date of Patent: *Oct. 26, 2021

(54) POWER CONTROL BASED ON PACKET TYPE

(71) Applicant: Sonos, Inc., Santa Barbara, CA (US)

(72) Inventors: Steve F. Holmgren, Santa Barbara, CA (US); John L. MacFarlane, Montecito, CA (US)

(73) Assignee: Sonos, Inc., Santa Barbara, CA (US)

( * ) Notice: Subject to any disclaimer, the term of this patent is extended or adjusted under 35 U.S.C. 154(b) by 162 days.

This patent is subject to a terminal disclaimer.

(21) Appl. No.: 16/531,951

(22) Filed: Aug. 5, 2019

(65) Prior Publication Data

US 2019/0354165 A1 Nov. 21, 2019

Related U.S. Application Data

(63) Continuation of application No. 15/245,591, filed on Aug. 24, 2016, now Pat. No. 10,372,200, which is a (Continued)

(51) Int. Cl.
*G06F 17/00* (2019.01)
*G06F 1/3296* (2019.01)
(Continued)

(52) U.S. Cl.
CPC .......... *G06F 1/3296* (2013.01); *G06F 1/3209* (2013.01); *G06F 1/3246* (2013.01);
(Continued)

(58) Field of Classification Search
CPC .... G06F 1/3209; G06F 1/3246; G06F 1/3296; G06F 3/162; G06F 3/165; H03F 1/52;
(Continued)

(56) References Cited

U.S. PATENT DOCUMENTS 3,956,591 A 5/1976 Gates, Jr.
4,105,974 A 8/1978 Rogers
(Continued)

FOREIGN PATENT DOCUMENTS

CA 2320451 A1 3/2001
CN 1598767 A 3/2005
(Continued)

OTHER PUBLICATIONS

Final Office Action dated Nov. 15, 2017, issued in connection with U.S. Appl. No. 15/245,501, filed on Aug. 24, 2016, 8 pages.
(Continued)

*Primary Examiner* — Joseph Saunders, Jr.
(74) *Attorney, Agent, or Firm* — Akerman LLP

(57) ABSTRACT

Techniques for controlling one or more audio amplifiers in or associated with a device coupled on a local area network are disclosed. An example playback device includes a processor, an amplifier, a network interface, and a memory. The memory includes a software module that, when executed by the processor, causes the playback device to: operate in a first power mode in which the amplifier consumes a first amount of power; while operating in the first power mode, determine that a defined time has passed since receiving, via the network interface, a specified type of data packet; and based on determining that the defined time has passed since receiving the specified type of data packet, transition from operating in the first power mode to operate in a second power mode in which the amplifier consumes a second amount of power, wherein the first amount of power is greater than the second amount of power.

20 Claims, 7 Drawing Sheets

Related U.S. Application Data continuation of application No. 14/977,597, filed on Dec. 21, 2015, now Pat. No. 10,303,240, which is a continuation of application No. 14/465,417, filed on Aug. 21, 2014, now Pat. No. 9,252,721, which is a continuation of application No. 13/212,889, filed on Aug. 18, 2011, now Pat. No. 8,843,224, which is a continuation of application No. 10/845,805, filed on May 15, 2004, now Pat. No. 8,024,055.

(51) Int. Cl.

| | | |
|---|---|---|
| H03F 1/52 | (2006.01) | |
| H03F 99/00 | (2009.01) | |
| H04R 27/00 | (2006.01) | |
| G06F 3/16 | (2006.01) | |
| H03F 3/183 | (2006.01) | |
| H03G 1/00 | (2006.01) | |
| H04L 29/06 | (2006.01) | |
| G06F 1/3209 | (2019.01) | |
| G06F 1/3246 | (2019.01) | |

(52) U.S. Cl.
CPC .............. *G06F 3/162* (2013.01); *G06F 3/165* (2013.01); *H03F 1/52* (2013.01); *H03F 3/183* (2013.01); *H03F 21/00* (2013.01); *H03G 1/0088* (2013.01); *H04L 69/22* (2013.01); *H04R 27/00* (2013.01); *H03F 2200/03* (2013.01); *H04R 2227/003* (2013.01); *H04R 2227/005* (2013.01); *H04R 2420/01* (2013.01)

(58) Field of Classification Search
CPC ...... H03F 3/183; H03F 21/00; H03F 2200/03; H03G 1/0088; H04L 69/22; H04R 2420/01; H04R 27/00; H04R 2227/003; H04R 2227/005
See application file for complete search history.

(56) References Cited

U.S. PATENT DOCUMENTS

| | | |
|---|---|---|
| D260,764 S | 9/1981 | Castagna et al. |
| 4,296,278 A | 10/1981 | Cullison et al. |
| 4,306,114 A | 12/1981 | Callahan |
| 4,509,211 A | 4/1985 | Robbins |
| D279,779 S | 7/1985 | Taylor |
| 4,530,091 A | 7/1985 | Crockett |
| 4,701,629 A | 10/1987 | Citroen |
| 4,712,105 A | 12/1987 | Koehler |
| D293,671 S | 1/1988 | Beaumont |
| 4,731,814 A | 3/1988 | Becker et al. |
| 4,824,059 A | 4/1989 | Butler |
| D301,037 S | 5/1989 | Matsuda |
| 4,845,751 A | 7/1989 | Schwab |
| D304,443 S | 11/1989 | Grinyer et al. |
| D313,023 S | 12/1990 | Kolenda et al. |
| D313,398 S | 1/1991 | Gilchrist |
| D313,600 S | 1/1991 | Weber |
| 4,994,908 A | 2/1991 | Kuban et al. |
| D320,598 S | 10/1991 | Auerbach et al. |
| D322,609 S | 12/1991 | Patton |
| 5,086,385 A | 2/1992 | Launey et al. |
| D326,450 S | 5/1992 | Watanabe |
| D327,060 S | 6/1992 | Wachob et al. |
| 5,151,922 A | 9/1992 | Weiss |
| D331,388 S | 12/1992 | Dahnert et al. |
| 5,182,552 A | 1/1993 | Paynting |
| D333,135 S | 2/1993 | Wachob et al. |
| 5,237,327 A | 8/1993 | Saitoh et al. |
| 5,255,094 A | 10/1993 | Yong et al. |
| 5,272,757 A | 12/1993 | Scofield et al. |
| D350,531 S | 9/1994 | Tsuji |
| D350,962 S | 9/1994 | Reardon et al. |
| 5,361,381 A | 11/1994 | Short |
| 5,372,441 A | 12/1994 | Louis |
| D354,059 S | 1/1995 | Hendricks |
| D354,751 S | 1/1995 | Hersh et al. |
| D356,093 S | 3/1995 | McCauley et al. |
| D356,312 S | 3/1995 | Althans |
| D357,024 S | 4/1995 | Tokiyama et al. |
| 5,406,634 A | 4/1995 | Anderson et al. |
| 5,430,485 A | 7/1995 | Lankford et al. |
| 5,440,644 A | 8/1995 | Farinelli et al. |
| D362,446 S | 9/1995 | Gasiorek et al. |
| 5,457,448 A | 10/1995 | Totsuka et al. |
| D363,933 S | 11/1995 | Starck |
| D364,877 S | 12/1995 | Tokiyama et al. |
| D364,878 S | 12/1995 | Green et al. |
| D365,102 S | 12/1995 | Gioscia |
| D366,044 S | 1/1996 | Hara et al. |
| 5,481,251 A | 1/1996 | Buys et al. |
| 5,515,345 A | 5/1996 | Barreira et al. |
| D372,716 S | 8/1996 | Thorne |
| 5,553,314 A | 9/1996 | Grube et al. |
| D377,651 S | 1/1997 | Biasotti et al. |
| 5,625,350 A | 4/1997 | Fukatsu et al. |
| D379,816 S | 6/1997 | Laituri et al. |
| 5,640,388 A | 6/1997 | Woodhead et al. |
| 5,642,171 A | 6/1997 | Baumgartner et al. |
| D380,752 S | 7/1997 | Hanson |
| D382,271 S | 8/1997 | Akwiwu |
| 5,661,665 A | 8/1997 | Glass et al. |
| 5,668,884 A | 9/1997 | Clair, Jr. et al. |
| 5,673,323 A | 9/1997 | Schotz et al. |
| D384,940 S | 10/1997 | Kono et al. |
| D387,352 S | 12/1997 | Kaneko et al. |
| D388,792 S | 1/1998 | Nykerk |
| D389,143 S | 1/1998 | Wicks |
| D392,641 S | 3/1998 | Fenner |
| D393,628 S | 4/1998 | Ledbetter et al. |
| 5,740,235 A | 4/1998 | Lester et al. |
| 5,742,623 A | 4/1998 | Nuber et al. |
| D394,659 S | 5/1998 | Biasotti et al. |
| 5,761,320 A | 6/1998 | Farinelli et al. |
| 5,774,016 A | 6/1998 | Ketterer |
| D395,889 S | 7/1998 | Gerba et al. |
| 5,790,543 A | 8/1998 | Cloutier |
| D397,996 S | 9/1998 | Smith |
| 5,812,201 A | 9/1998 | Yoo |
| 5,818,948 A | 10/1998 | Gulick |
| 5,822,598 A | 10/1998 | Lam |
| D401,587 S | 11/1998 | Rudolph |
| 5,832,024 A | 11/1998 | Schotz et al. |
| 5,848,152 A | 12/1998 | Slipy et al. |
| 5,852,722 A | 12/1998 | Hamilton |
| D404,741 S | 1/1999 | Schumaker et al. |
| 5,857,115 A | 1/1999 | Tanaka |
| D405,071 S | 2/1999 | Gambaro |
| 5,875,233 A | 2/1999 | Cox |
| D406,847 S | 3/1999 | Gerba et al. |
| D407,071 S | 3/1999 | Keating |
| 5,900,026 A | 5/1999 | Ryu |
| 5,905,768 A | 5/1999 | Maturi et al. |
| D410,927 S | 6/1999 | Yamagishi |
| D412,337 S | 7/1999 | Hamano |
| 5,923,902 A | 7/1999 | Inagaki |
| 5,946,343 A | 8/1999 | Schotz et al. |
| 5,949,776 A | 9/1999 | Mahany et al. |
| 5,956,025 A | 9/1999 | Goulden et al. |
| 5,960,006 A | 9/1999 | Maturi et al. |
| D415,496 S | 10/1999 | Gerba et al. |
| D416,021 S | 11/1999 | Godette et al. |
| 5,984,512 A | 11/1999 | Jones et al. |
| 5,987,611 A | 11/1999 | Freund |
| 5,990,884 A | 11/1999 | Douma et al. |
| 5,991,307 A | 11/1999 | Komuro et al. |
| 5,999,906 A | 12/1999 | Mercs et al. |
| 6,018,376 A | 1/2000 | Nakatani |
| D420,006 S | 2/2000 | Tonino |
| 6,029,196 A | 2/2000 | Lenz |
| 6,032,202 A | 2/2000 | Lea et al. |
| 6,038,614 A | 3/2000 | Chan et al. |

(56) References Cited

U.S. PATENT DOCUMENTS

| | | |
|---|---|---|
| 6,046,550 A | 4/2000 | Ference et al. |
| 6,061,457 A | 5/2000 | Stockhamer |
| 6,081,266 A | 6/2000 | Sciammarella |
| 6,088,063 A | 7/2000 | Shiba |
| D429,246 S | 8/2000 | Holma |
| D430,143 S | 8/2000 | Renk |
| 6,101,195 A | 8/2000 | Lyons et al. |
| 6,119,239 A | 9/2000 | Fujii |
| 6,122,749 A | 9/2000 | Gulick |
| D431,552 S | 10/2000 | Backs et al. |
| D432,525 S | 10/2000 | Beecroft |
| 6,127,941 A | 10/2000 | Van Ryzin |
| 6,148,205 A | 11/2000 | Cotton |
| 6,148,345 A | 11/2000 | Yamaki |
| 6,154,488 A | 11/2000 | Hunt |
| 6,157,726 A | 12/2000 | Carroll et al. |
| 6,169,725 B1 | 1/2001 | Gibbs et al. |
| 6,181,383 B1 | 1/2001 | Fox et al. |
| 6,195,435 B1 | 2/2001 | Kitamura |
| 6,212,282 B1 | 4/2001 | Mershon |
| 6,246,701 B1 | 6/2001 | Slattery |
| D444,475 S | 7/2001 | Levey et al. |
| 6,256,554 B1 | 7/2001 | Dilorenzo |
| 6,269,406 B1 | 7/2001 | Dutcher et al. |
| 6,295,356 B1 | 9/2001 | De |
| 6,301,012 B1 | 10/2001 | White et al. |
| 6,310,652 B1 | 10/2001 | Li et al. |
| 6,311,279 B1 | 10/2001 | Nguyen |
| 6,313,879 B1 | 11/2001 | Kubo et al. |
| 6,316,992 B1 | 11/2001 | Miao et al. |
| 6,317,789 B1 | 11/2001 | Rakavy et al. |
| 6,321,252 B1 | 11/2001 | Bhola et al. |
| D452,520 S | 12/2001 | Gotham et al. |
| 6,353,172 B1 | 3/2002 | Fay et al. |
| 6,356,871 B1 | 3/2002 | Hemkumar et al. |
| 6,359,872 B1 | 3/2002 | Mahany et al. |
| 6,366,582 B1 | 4/2002 | Nishikado et al. |
| 6,388,514 B1 | 5/2002 | King et al. |
| 6,404,811 B1 | 6/2002 | Cvetko et al. |
| 6,418,150 B1 | 7/2002 | Staats |
| 6,442,443 B1 | 8/2002 | Fujii et al. |
| D462,339 S | 9/2002 | Allen et al. |
| D462,340 S | 9/2002 | Allen et al. |
| D462,945 S | 9/2002 | Skulley |
| 6,449,642 B2 | 9/2002 | Bourke-Dunphy et al. |
| 6,456,783 B1 | 9/2002 | Ando et al. |
| 6,463,474 B1 | 10/2002 | Fuh et al. |
| 6,466,832 B1 | 10/2002 | Zuqert et al. |
| 6,469,633 B1 | 10/2002 | Wachter et al. |
| D466,108 S | 11/2002 | Glodava et al. |
| 6,487,296 B1 | 11/2002 | Allen et al. |
| 6,493,824 B1 | 12/2002 | Novoa et al. |
| 6,493,832 B1 | 12/2002 | Itakura et al. |
| D468,297 S | 1/2003 | Ikeda |
| 6,522,886 B1 | 2/2003 | Youngs et al. |
| 6,535,121 B2 | 3/2003 | Mathney et al. |
| D474,763 S | 5/2003 | Tozaki et al. |
| D475,993 S | 6/2003 | Meyer |
| D476,643 S | 7/2003 | Yamagishi |
| D477,310 S | 7/2003 | Moransais |
| 6,590,982 B1 | 7/2003 | Chen |
| D478,051 S | 8/2003 | Sagawa |
| D478,069 S | 8/2003 | Beck et al. |
| D478,896 S | 8/2003 | Summers |
| 6,611,537 B1 | 8/2003 | Edens et al. |
| D479,520 S | 9/2003 | De |
| D481,056 S | 10/2003 | Kawasaki et al. |
| 6,631,410 B1 | 10/2003 | Kowalski et al. |
| 6,636,269 B1 | 10/2003 | Baldwin |
| 6,653,899 B2 | 11/2003 | Organvidez et al. |
| 6,654,720 B1 | 11/2003 | Graham et al. |
| 6,654,956 B1 | 11/2003 | Trinh et al. |
| 6,684,060 B1 | 1/2004 | Curtin |
| D486,145 S | 2/2004 | Kaminski et al. |
| 6,690,431 B1 | 2/2004 | Yang et al. |
| 6,703,940 B1 | 3/2004 | Allen et al. |
| 6,704,421 B1 | 3/2004 | Kitamura |
| 6,741,961 B2 | 5/2004 | Lim |
| D491,925 S | 6/2004 | Griesau et al. |
| 6,757,517 B2 | 6/2004 | Chang et al. |
| D493,148 S | 7/2004 | Shibata et al. |
| D495,333 S | 8/2004 | Borsboom |
| 6,778,073 B2 | 8/2004 | Lutter et al. |
| 6,778,869 B2 | 8/2004 | Champion |
| D496,003 S | 9/2004 | Spira |
| D496,005 S | 9/2004 | Wang |
| D496,335 S | 9/2004 | Spira |
| D497,363 S | 10/2004 | Olson et al. |
| 6,804,351 B1 | 10/2004 | Karam |
| D499,086 S | 11/2004 | Polito |
| 6,816,510 B1 | 11/2004 | Banerjee |
| 6,826,283 B1 | 11/2004 | Wheeler et al. |
| D499,395 S | 12/2004 | Hsu |
| D499,718 S | 12/2004 | Chen |
| D500,015 S | 12/2004 | Gubbe |
| D501,477 S | 2/2005 | Hall |
| 6,859,460 B1 | 2/2005 | Chen |
| 6,859,538 B1 | 2/2005 | Voltz |
| 6,873,862 B2 | 3/2005 | Reshefsky |
| D504,872 S | 5/2005 | Uehara et al. |
| D504,885 S | 5/2005 | Zhang et al. |
| 6,901,439 B1 | 5/2005 | Bonasia et al. |
| D506,463 S | 6/2005 | Daniels |
| 6,915,347 B2 | 7/2005 | Hanko et al. |
| 6,919,771 B2 | 7/2005 | Nakajima |
| 6,931,557 B2 | 8/2005 | Togawa |
| 6,937,988 B1 | 8/2005 | Hemkumar et al. |
| 6,970,940 B1 | 11/2005 | Vogel et al. |
| 6,975,211 B2 | 12/2005 | Atsuta et al. |
| 6,987,767 B2 | 1/2006 | Saito |
| D515,072 S | 2/2006 | Lee |
| D515,557 S | 2/2006 | Okuley |
| D518,475 S | 4/2006 | Yang et al. |
| 7,046,677 B2 | 5/2006 | Monta et al. |
| D524,296 S | 7/2006 | Kita |
| D527,375 S | 8/2006 | Flora et al. |
| 7,092,528 B2 | 8/2006 | Patrick et al. |
| 7,092,694 B2 | 8/2006 | Griep et al. |
| 7,096,169 B2 | 8/2006 | Crutchfield et al. |
| 7,120,168 B2 | 10/2006 | Zimmermann |
| 7,126,945 B2 | 10/2006 | Beach |
| 7,130,316 B2 | 10/2006 | Kovacevic |
| 7,130,608 B2 | 10/2006 | Hollstrom et al. |
| 7,130,616 B2 | 10/2006 | Janik |
| 7,136,934 B2 | 11/2006 | Carter et al. |
| 7,139,981 B2 | 11/2006 | Mayer et al. |
| 7,143,939 B2 | 12/2006 | Henzerling |
| 7,146,260 B2 | 12/2006 | Preston et al. |
| 7,161,939 B2 | 1/2007 | Israel et al. |
| 7,196,584 B2 | 3/2007 | Harris |
| 7,197,148 B2 | 3/2007 | Nourse et al. |
| 7,206,618 B2 | 4/2007 | Latto et al. |
| 7,218,708 B2 | 5/2007 | Berezowski et al. |
| 7,236,461 B1 | 6/2007 | Sonti et al. |
| 7,236,773 B2 | 6/2007 | Thomas |
| 7,260,616 B1 | 8/2007 | Cook |
| 7,263,110 B2 | 8/2007 | Fujishiro |
| 7,269,338 B2 | 9/2007 | Janevski |
| 7,277,547 B1 | 10/2007 | Delker et al. |
| 7,289,631 B2 | 10/2007 | Ishidoshiro |
| 7,295,548 B2 | 11/2007 | Blank et al. |
| 7,305,694 B2 | 12/2007 | Commons et al. |
| 7,308,188 B2 | 12/2007 | Namatame |
| 7,313,384 B1 | 12/2007 | Meenan et al. |
| 7,324,857 B2 | 1/2008 | Goddard |
| 7,356,011 B1 | 4/2008 | Waters et al. |
| 7,366,206 B2 | 4/2008 | Lockridge et al. |
| 7,378,903 B2 | 5/2008 | Bates et al. |
| 7,391,791 B2 | 6/2008 | Balassanian et al. |
| 7,428,310 B2 | 9/2008 | Park |
| 7,430,181 B1 | 9/2008 | Hong |
| 7,457,948 B1 | 11/2008 | Bilicksa et al. |
| 7,472,058 B2 | 12/2008 | Tseng et al. |
| 7,483,538 B2 | 1/2009 | McCarty et al. |

(56) References Cited

U.S. PATENT DOCUMENTS

| | | |
|---|---|---|
| 7,492,912 B2 | 2/2009 | Chung et al. |
| 7,505,889 B2 | 3/2009 | Salmonsen et al. |
| 7,548,744 B2 | 6/2009 | Oesterling et al. |
| 7,548,851 B1 | 6/2009 | Lau et al. |
| 7,558,224 B1 | 7/2009 | Surazski et al. |
| 7,558,635 B1 | 7/2009 | Thiel et al. |
| 7,571,014 B1 | 8/2009 | Lambourne et al. |
| 7,627,825 B2 | 12/2009 | Kakuda |
| 7,630,501 B2 | 12/2009 | Blank et al. |
| 7,643,894 B2 | 1/2010 | Braithwaite et al. |
| 7,653,344 B1 | 1/2010 | Feldman et al. |
| 7,657,910 B1 | 2/2010 | McAulay et al. |
| 7,668,925 B1 | 2/2010 | Liao et al. |
| 7,672,463 B2 | 3/2010 | Park et al. |
| 7,675,943 B2 | 3/2010 | Mosig et al. |
| 7,676,044 B2 | 3/2010 | Sasaki et al. |
| 7,676,142 B1 | 3/2010 | Hung |
| 7,688,306 B2 | 3/2010 | Wehrenberg et al. |
| 7,696,816 B2 | 4/2010 | Bates |
| 7,710,941 B2 | 5/2010 | Rietschel et al. |
| 7,721,032 B2 | 5/2010 | Bushell et al. |
| 7,746,906 B2 | 6/2010 | Jinzaki et al. |
| 7,761,176 B2 | 7/2010 | Ben-Yaacov et al. |
| 7,831,054 B2 | 11/2010 | Ball et al. |
| 7,853,341 B2 | 12/2010 | McCarty et al. |
| 7,882,234 B2 | 2/2011 | Watanabe et al. |
| 7,933,418 B2 | 4/2011 | Morishima |
| 7,945,636 B2 | 5/2011 | Nelson et al. |
| 7,945,708 B2 | 5/2011 | Ohkita |
| 7,966,388 B1 | 6/2011 | Pugaczewski et al. |
| 7,987,294 B2 | 7/2011 | Bryce et al. |
| 7,995,732 B2 | 8/2011 | Koch et al. |
| 8,014,423 B2 | 9/2011 | Thaler et al. |
| 8,024,055 B1 | 9/2011 | Holmgren et al. |
| 8,041,062 B2 | 10/2011 | Cohen et al. |
| 8,045,952 B2 | 10/2011 | Qureshey et al. |
| 8,050,203 B2 | 11/2011 | Jacobsen et al. |
| 8,103,009 B2 | 1/2012 | McCarty et al. |
| 8,150,079 B2 | 4/2012 | Maeda et al. |
| 8,156,360 B2 | 4/2012 | Paljug |
| 8,170,222 B2 | 5/2012 | Dunko |
| 8,189,816 B2 | 5/2012 | Solow |
| 8,233,029 B2 | 7/2012 | Yoshida et al. |
| 8,234,395 B2 | 7/2012 | Millington et al. |
| 8,311,226 B2 | 11/2012 | Lorgeoux et al. |
| 8,374,595 B2 | 2/2013 | Chien et al. |
| 8,411,883 B2 | 4/2013 | Matsumoto |
| 8,442,239 B2 | 5/2013 | Bruelle-Drews et al. |
| 8,477,958 B2 | 7/2013 | Moeller et al. |
| 8,483,853 B1 | 7/2013 | Lambourne |
| 8,565,455 B2 | 10/2013 | Worrell et al. |
| 8,600,084 B1 | 12/2013 | Garrett |
| 8,601,394 B2 | 12/2013 | Sheehan et al. |
| 8,654,995 B2 | 2/2014 | Silber et al. |
| 8,688,431 B2 | 4/2014 | Lyons et al. |
| 8,843,224 B2 | 9/2014 | Holmgren et al. |
| 8,861,739 B2 | 10/2014 | Ojanpera |
| 8,942,252 B2 | 1/2015 | Balassanian et al. |
| 8,942,395 B2 | 1/2015 | Lissaman et al. |
| 9,179,197 B2 | 11/2015 | Beckhardt et al. |
| 9,195,258 B2 | 11/2015 | Millington |
| 9,246,442 B2 | 1/2016 | Holmgren et al. |
| 9,252,721 B2 | 2/2016 | Holmgren et al. |
| 9,319,225 B2 | 4/2016 | Garg et al. |
| 9,521,074 B2 | 12/2016 | Peters et al. |
| 2001/0042107 A1 | 11/2001 | Palm |
| 2001/0043456 A1 | 11/2001 | Atkinson |
| 2001/0050991 A1 | 12/2001 | Eves |
| 2002/0022453 A1 | 2/2002 | Balog et al. |
| 2002/0026442 A1 | 2/2002 | Lipscomb et al. |
| 2002/0072816 A1 | 6/2002 | Shdema et al. |
| 2002/0072817 A1 | 6/2002 | Champion |
| 2002/0078293 A1 | 6/2002 | Kou et al. |
| 2002/0083172 A1 | 6/2002 | Knowles et al. |
| 2002/0083342 A1 | 6/2002 | Webb et al. |
| 2002/0083351 A1 | 6/2002 | Brabenac |
| 2002/0101357 A1 | 8/2002 | Gharapetian |
| 2002/0101651 A1 | 8/2002 | Dugan et al. |
| 2002/0112084 A1 | 8/2002 | Deen et al. |
| 2002/0124097 A1 | 9/2002 | Isely et al. |
| 2002/0131761 A1 | 9/2002 | Kawasaki et al. |
| 2002/0137505 A1 | 9/2002 | Eiche et al. |
| 2002/0150053 A1 | 10/2002 | Gray et al. |
| 2002/0165921 A1 | 11/2002 | Sapieyevski |
| 2002/0188762 A1 | 12/2002 | Tomassetti et al. |
| 2003/0014486 A1 | 1/2003 | May |
| 2003/0023411 A1 | 1/2003 | Witmer et al. |
| 2003/0043856 A1 | 3/2003 | Lakaniemi et al. |
| 2003/0046703 A1 | 3/2003 | Knowles et al. |
| 2003/0063755 A1 | 4/2003 | Nourse et al. |
| 2003/0073432 A1 | 4/2003 | Meade |
| 2003/0103088 A1 | 6/2003 | Dresti et al. |
| 2003/0157951 A1 | 8/2003 | Hasty |
| 2003/0167335 A1 | 9/2003 | Alexander |
| 2003/0179780 A1 | 9/2003 | Walker et al. |
| 2003/0185400 A1 | 10/2003 | Yoshizawa et al. |
| 2003/0198257 A1 | 10/2003 | Sullivan et al. |
| 2003/0210796 A1 | 11/2003 | McCarty et al. |
| 2003/0212802 A1 | 11/2003 | Rector et al. |
| 2003/0219007 A1 | 11/2003 | Barrack et al. |
| 2003/0231208 A1 | 12/2003 | Hanon et al. |
| 2004/0001591 A1 | 1/2004 | Mani et al. |
| 2004/0014426 A1 | 1/2004 | Moore |
| 2004/0019807 A1 | 1/2004 | Freund et al. |
| 2004/0024478 A1 | 2/2004 | Hans et al. |
| 2004/0037433 A1 | 2/2004 | Chen |
| 2004/0042629 A1 | 3/2004 | Mellone et al. |
| 2004/0059842 A1 | 3/2004 | Hanson et al. |
| 2004/0117462 A1 | 6/2004 | Bodin et al. |
| 2004/0168081 A1 | 8/2004 | Ladas et al. |
| 2004/0171346 A1 | 9/2004 | Lin |
| 2004/0177167 A1 | 9/2004 | Iwamura et al. |
| 2004/0183827 A1 | 9/2004 | Putterman et al. |
| 2004/0185773 A1 | 9/2004 | Gerber et al. |
| 2004/0203590 A1 | 10/2004 | Shteyn |
| 2004/0223622 A1 | 11/2004 | Lindemann et al. |
| 2004/0249490 A1 | 12/2004 | Sakai |
| 2004/0252400 A1 | 12/2004 | Blank et al. |
| 2004/0253969 A1 | 12/2004 | Nguyen et al. |
| 2005/0060435 A1 | 3/2005 | Xue et al. |
| 2005/0131558 A1 | 6/2005 | Braithwaite et al. |
| 2005/0135304 A1 | 6/2005 | Wentink et al. |
| 2005/0154766 A1 | 7/2005 | Huang et al. |
| 2005/0160270 A1 | 7/2005 | Goldberg et al. |
| 2005/0177256 A1 | 8/2005 | Shintani et al. |
| 2005/0197725 A1 | 9/2005 | Alexander et al. |
| 2005/0198219 A1 | 9/2005 | Banerjee et al. |
| 2006/0072489 A1 | 4/2006 | Toyoshima |
| 2006/0158168 A1 | 7/2006 | Yoshida et al. |
| 2006/0173844 A1 | 8/2006 | Zhang et al. |
| 2006/0209785 A1 | 9/2006 | Iovanna et al. |
| 2006/0222186 A1 | 10/2006 | Paige et al. |
| 2006/0227985 A1 | 10/2006 | Kawanami |
| 2006/0259649 A1 | 11/2006 | Hsieh et al. |
| 2006/0270395 A1 | 11/2006 | Dhawan et al. |
| 2007/0087686 A1 | 4/2007 | Holm et al. |
| 2007/0142944 A1 | 6/2007 | Goldberg et al. |
| 2007/0220150 A1 | 9/2007 | Garg |
| 2008/0075295 A1 | 3/2008 | Mayman et al. |
| 2008/0089338 A1 | 4/2008 | Campbell et al. |
| 2008/0109852 A1 | 5/2008 | Kretz et al. |
| 2008/0170511 A1 | 7/2008 | Shorty et al. |
| 2008/0205070 A1 | 8/2008 | Osada |
| 2008/0215169 A1 | 9/2008 | Debettencourt et al. |
| 2008/0303947 A1 | 12/2008 | Ohnishi et al. |
| 2009/0011798 A1 | 1/2009 | Yamada |
| 2009/0070434 A1 | 3/2009 | Himmelstein |
| 2009/0122737 A1 | 5/2009 | Twitchell, Jr. |
| 2009/0124289 A1 | 5/2009 | Nishida |
| 2009/0133040 A1 | 5/2009 | Stevens, I |
| 2010/0087089 A1 | 4/2010 | Struthers et al. |
| 2010/0171587 A1 | 7/2010 | Yoon et al. |
| 2010/0216524 A1 | 8/2010 | Thomas et al. |
| 2011/0001632 A1 | 1/2011 | Hohorst |

(56) References Cited

U.S. PATENT DOCUMENTS

| | | | |
|---|---|---|---|
| 2011/0299696 | A1 | 12/2011 | Holmgren et al. |
| 2011/0316768 | A1 | 12/2011 | McRae |
| 2012/0051567 | A1 | 3/2012 | Castor-Perry |
| 2012/0237059 | A1 | 9/2012 | Saito |
| 2012/0320793 | A1 | 12/2012 | Balbierer et al. |
| 2015/0365987 | A1 | 12/2015 | Weel |

FOREIGN PATENT DOCUMENTS

| | | | |
|---|---|---|---|
| EP | 1312188 | A1 | 5/2003 |
| EP | 1389853 | A1 | 2/2004 |
| EP | 1517464 | A2 | 3/2005 |
| EP | 1416687 | B1 | 8/2006 |
| EP | 1410686 | | 3/2008 |
| EP | 0742674 | B1 | 4/2014 |
| GB | 2379533 | A | 3/2003 |
| JP | 63269633 | | 11/1988 |
| JP | 2000149391 | A | 5/2000 |
| TW | 439027 | | 6/2001 |
| WO | 9709756 | A2 | 3/1997 |
| WO | 1999023560 | | 5/1999 |
| WO | 0019693 | A1 | 4/2000 |
| WO | 200153994 | | 7/2001 |
| WO | 2003093950 | A2 | 11/2003 |
| WO | 2007135581 | A2 | 11/2007 |
| WO | 2008082350 | A1 | 7/2008 |
| WO | 2009038687 | A2 | 3/2009 |

OTHER PUBLICATIONS

Final Office Action dated Oct. 17, 2017, issued in connection with U.S. Appl. No. 14/977,612, filed on Dec. 21, 2015, 16 pages.
Final Office Action dated Oct. 18, 2017, issued in connection with U.S. Appl. No. 15/245,591, filed on Aug. 24, 2016, 16 pages.
Final Office Action dated Jan. 29, 2014, issued in connection with U.S. Appl. No. 13/212,889, filed on Aug. 18, 2011, 13 pages.
Final Office Action dated Apr. 3, 2018, issued in connection with U.S. Appl. No. 15/245,616, filed on Aug. 24, 2016, 6 pages.
Final Office Action dated Jan. 4, 2019, issued in connection with U.S. Appl. No. 15/245,591, filed on Aug. 24, 2016, 6 pages.
Fireball DVD and Music Manager DVDM-100 Installation and User's Guide, Copyright 2003, 185 pages.
Fireball MP-200 User's Manual, Copyright 2006, 93 pages.
Fireball Remote Control Guide WD006-1-1, Copyright 2003, 19 pages.
Fireball SE-D1 User's Manual, Copyright 2005, 90 pages.
Fober et al., "Clock Skew Compensation over a High Latency Network," Proceedings of the ICMC, 2002, pp. 548-552.
Fries et al. "The MP3 and Internet Audio Handbook: Your Guide to the Digital Music Revolution." 2000, 320 pages.
Gaston et al., "Methods for Sharing Stereo and Multichannel Recordings Among Planetariums," Audio Engineering Society Convention Paper 7474, 2008, 15 pages.
General Event Notification Architecture Base: Client to Arbiter (Apr. 2000) (23 pages).
Hierre et al., "The Reference Model Architecture for MPEG Spatial Audio Coding," Audio Engineering Society Convention Paper (Presented at the 118th Convention), May 28-31, 2005, 13 pages.
Home Networking with Universal Plug and Play, IEEE Communications Magazine, vol. 39 No. 12 (Dec. 2001) (D+M_0402025-40) (16 pages).
"Home Theater Control Systems," Cinema Source, 2002, 19 pages.
IBM Home Director Installation and Service Manual, Copyright1998, 124 pages.
IBM Home Director Owner's Manual, Copyright 1999, 67 pages.
*Implicit, LLC v. Sonos, Inc.*, Defendant's Original Complaint (Mar. 3, 2017) (15 pages).
Integra Audio Network Receiver NAC 2.3 Instruction Manual, 68 pages.

Integra Audio Network Server NAS 2.3 Instruction Manual, pp. 1-32.
Integra Service Manual, Audio Network Receiver Model NAC-2.3, Dec. 2002, 44 pages.
Intel Designing a UPnP AV Media Renderer, v. 1.0 ("Intel AV Media Renderer") (May 20, 2003) (SONDM000115117-62) (46 pages).
Intel Media Renderer Device Interface ("Intel Media Renderer") (Sep. 6, 2002) (62 pages).
Intel SDK for UPnP Devices Programming Guide, Version 1.2.1, (Nov. 2002) (30 pages).
Ishibashi et al., "A Comparison of Media Synchronization Quality Among Reactive Control Schemes," IEEE Infocom, 2001, pp. 77-84.
Issues with Mixed IEEE 802.b/802.11g Networks, AVAG00058, Agere Systems, Feb. 2004, 5 pages.
Jo et al., "Synchronized One-to-many Media Streaming with Adaptive Playout Control," Proceedings of SPIE, 2002, pp. 71-82, vol. 4861.
Jones, Stephen, "Dell Digital Audio Receiver: Digital upgrade for your analog stereo," Analog Stereo, Jun. 24, 2000 retrieved Jun. 18, 2014, 2 pages.
Kim et al., "Optimal Anycast Technique for Delay-Sensitive Energy-Constrained Asynchronous Sensor Networks," 23 pages, Apr. 2011.
Lake Processors: Lake® LM Series Digital Audio Processors Operation Manual, 2011, 71 pages.
Levi et al., Request for Comments 4318, Definitions of Managed Objects for Bridges with Rapid Spanning Tree Protocol, Dec. 2005,14 pages.
LG Musicflow, http://www.lg.com/uk/musicflow/av/MusicFlow_faq#a4, "LG Hi-Fi Audio", Sep. 20, 2015, 22 pages.
LG: RJP-201M Remote Jack Pack Installation and Setup Guide, 2010, 24 pages.
Lienhart et al., "On the Importance of Exact Synchronization for Distributed Audio Signal Processing," Session L: Poster Session II—ICASSP'03 Papers, 2002, 1 page.
LinkSys by Cisco, Wireless Home Audio Controller, Wireless-N Touchscreen Remote DMRW1000 Datasheet, Copyright 2008, 2 pages.
LinkSys by Cisco, Wireless Home Audio Controller, Wireless-N Touchscreen Remote DMRW1000 User Guide, Copyright 2008, 64 pages.
LinkSys by Cisco, Wireless Home Audio Player, Wireless-N Music Extender DMP100 Quick Installation Guide, Copyright 2009, 32 pages.
LinkSys by Cisco, Wireless Home Audio Player, Wireless-N Music Extender DMP100 User Guide, Copyright 2008, 65 pages.
Linux SDK for UPnP Devices v. 1.2 (Sep. 6, 2002) (101 pages).
Liu et al., "A synchronization control scheme for real-time streaming multimedia applications," Packet Video, 2003, 10 pages, vol. 2003.
Liu et al., "Adaptive Delay Concealment for Internet Voice Applications with Packet-Based Time-Scale Modification," Information Technologies 2000, pp. 91-102.
Louderback, Jim, "Affordable Audio Receiver Furnishes Homes With MP3," TechTV Vault. Jun. 28, 2000 retrieved Jul. 10, 2014, 2 pages.
MediaRenderer:1 Device Template Version 1.01 for UPnP, Version 1.0 (Jun. 25, 2002) (12 pages).
MediaServer:1 Device Template Version 1.01 for UPnP, Version 1.0 (Jun. 25, 2002) (12 pages).
Microsoft, Universal Plug and Play (UPnP) Client Support ("Microsoft UPnP") (Aug. 2001) (D+M_0402007-24) (18 pages).
Microsoft Window's XP Reviewer's Guide (Aug. 2001) (D+M_0402225-85) (61 pages).
"Microsoft Windows XP File and Printer Share with Microsoft Windows" Microsoft Windows XP Technical Article, 2003, 65 pages.
"Model MRC44 Four Zone—Four Source Audio/Video Controller/Amplifier System," Xantech Corporation, 2002, 52 pages.
U.S. Appl. No. 60/490,768, filed on Jul. 28, 2003, entitled "Method for synchronizing audio playback between multiple networked devices," 13 pages.

(56) References Cited

OTHER PUBLICATIONS

U.S. Appl. No. 60/825,407 filed on Sep. 12, 2006, entitled "Controlling and manipulating groupings in a multi-zone music or media system," 82 pages.
Universal Plug and Play Device Architecture V. 1.0, (Jun. 8, 2000) (54 pages).
Universal Plug and Play in Windows XP, Tom Fout. Microsoft Corporation (Jul. 2001) (D+M_0402041-73) (33 pages).
Universal Plug and Play ("UPnP") AV Architecture:1 for UPnP, Version 1.0, (Jun. 25, 2002) (D+M_0298151-72) (22 pages).
Universal Plug and Play Vendor's Implementation Guide (Jan. 5, 2000) (7 pages).
UPnP AV Architecture:0.83 (Jun. 12, 2002) (SONDM000115483-504) (22 pages).
UPnP Design by Example, A Software Developers Guide to Universal Plug and Play Michael Jeronimo and JackWeast, Intel Press (D+M_0401307-818) (Apr. 2003) (511 pages).
UPnP; "Universal Plug and Play Device Architecture," Jun. 8, 2000; version 1.0; Microsoft Corporation; pp. 1-54.
WANCommonInterfaceConfig:1 Service Template Version 1.01 for UPnP, Ver. 1.0 (Nov. 12, 2001) (D+M_0401820-43) (24 pages).
WANIPConnection:1 Service Template Version 1.01 for UPnP Ver. 1.0 (Nov. 12, 2001) (D+M_0401844-917) (74 pages).
WANPPPConnection:1 Service Template Version 1.01 for UPnP, Version 1.0 (Nov. 12, 2001) (D+M_0401918-2006) (89 pages).
WaveLan High-Speed Multimode Chip Set, AVAGO0003, Agere Systems, Feb. 2003, 4 pages.
WaveLan High-Speed Multimode Chip Set, AVAGO0005, Agere Systems, Feb. 2003, 4 pages.
WaveLAN Wireless Integration Developer Kit (WI-DK) for Access Point Developers, AVAGO0054, Agere Systems, Jul. 2003, 2 pages.
WaveLAN Wireless Integration-Developer Kit (WI-DK) Hardware Control Function (HCF), AVAGO0052, Agere Systems, Jul. 2003, 2 pages.
WI-DK Release 2 WaveLan Embedded Drivers for VxWorks and Linux, AVAGO0056, Agere Systems, Jul. 2003, 2 pages.
WI-DK Release 2 WaveLan END Reference Driver for VxWorks, AVAGO0044, Agere Systems, Jul. 2003, 4 pages.
WI-DK Release 2 WaveLan LKM Reference Drivers for Linux, AVAGO0048, Agere Systems, Jul. 2003, 4 pages.
Windows Media Connect Device Compatibility Specification (Apr. 12, 2004) (16 pages).
WPA Reauthentication Rates, AVAGO0063, Agere Systems, Feb. 2004, 3 pages.
Yamaha DME 64 Owner's Manual; copyright 2004, 80 pages.
Yamaha DME Designer 3.5 setup manual guide; copyright 2004, 16 pages.
Yamaha DME Designer 3.5 User Manual; Copyright 2004, 507 pages.
"Symantec pcAnywhere User's Guide," v 10.5.1, 1995-2002, 154 pages.
"Systemline Modular Installation Guide, Multiroom System," Systemline, 2003, pp. 1-22.
"ZR-8630AV MultiZone Audio/Video Receiver, Installation and Operation Guide," Niles Audio Corporation, 2003, 86 pages.
ZX135: Installation Manual,LA Audio, Apr. 2003, 44 pages.
"SMPTE Made Simple: A Time Code Tutor by Timeline," 1996, 46 pages.
Network Time Protocol (NTP), RFC 1305 (Mar. 1992) (D+M_0397417-536) (120 pages).
"NexSys Software v.3 Manual," Crest Audio, Inc., 1997, 76 pages.
Niederst, Jennifer "O'Reilly Web Design in a Nutshell," Second Edition, Sep. 2001, 678 pages.
Non-Final Office Action dated Jul. 17, 2015, issued in connection with U.S. Appl. No. 14/465,417, filed on Aug. 21, 2014, 13 pages.
Non-Final Office Action dated Feb. 8, 2017, issued in connection with U.S. Appl. No. 15/245,501, filed on Aug. 24, 2016, 12 pages.
Non-Final Office Action dated Feb. 8, 2017, issued in connection with U.S. Appl. No. 15/245,591, filed on Aug. 24, 2016, 12 pages.
Non-Final Office Action dated Sep. 8, 2016, issued in connection with U.S. Appl. No. 14/977,612, filed on Dec. 21, 2015, 7 pages.
Non-Final Office Action dated Apr. 9, 2008, issued in connection with U.S. Appl. No. 10/845,805, filed on May 15, 2004, 16 pages.
Non-Final Office Action dated Sep. 9, 2016, issued in connection with U.S. Appl. No. 14/977,597, filed on Dec. 21, 2015, 7 pages.
Non-Final Office Action dated Feb. 10, 2017, issued in connection with U.S. Appl. No. 14/977,612, filed on Dec. 21, 2015, 15 pages.
Non-Final Office Action dated Nov. 14, 2017, issued in connection with U.S. Appl. No. 15/245,616, filed on Aug. 24, 2016, 8 pages.
Non-Final Office Action dated Jul. 16, 2013, issued in connection with U.S. Appl. No. 13/212,889, filed on Aug. 18, 2011, 11 pages.
Non-Final Office Action dated May 16, 2018, issued in connection with U.S. Appl. No. 15/245,591, filed on Aug. 24, 2016, 10 pages.
Non-Final Office Action dated Aug. 17, 2010, issued in connection with U.S. Appl. No. 10/845,805, filed on May 15, 2004, 19 pages.
Non-Final Office Action dated Jul. 17, 2015, issued in connection with U.S. Appl. No. 14/486,648, filed on Sep. 15, 2014, 12 pages.
Non-Final Office Action dated Jun. 22, 2007, issued in connection with U.S. Appl. No. 10/845,805, filed May 15, 2004, 16 pages.
Non-Final Office Action dated Feb. 24, 2017, issued in connection with U.S. Appl. No. 14/977,597, filed on Dec. 21, 2015, 14 pages.
Non-Final Office Action dated May 31, 2018, issued in connection with U.S. Appl. No. 14/977,597, filed on Dec. 21, 2015, 7 pages.
Non-Final Office Action dated May 31, 2018, issued in connection with U.S. Appl. No. 15/245,501, filed on Aug. 24, 2016, 6 pages.
Non-Final Office Action dated Apr. 6, 2017, issued in connection with U.S. Appl. No. 14/950,233, filed on Nov. 24, 2015, 16 pages.
Non-Final Office Action dated Feb. 7, 2018, issued in connection with U.S. Appl. No. 15/245,569, filed on Aug. 24, 2016, 22 pages.
Notice of Allowance dated Dec. 2, 2015, issued in connection with U.S. Appl. No. 14/486,648, filed on Sep. 15, 2014, 6 pages.
Notice of Allowance dated Dec. 7, 2015, issued in connection with U.S. Appl. No. 14/465,417, filed on Aug. 21, 2014, 6 pages.
Notice of Allowance dated Jun. 7, 2018, issued in connection with U.S. Appl. No. 14/977,612, filed on Dec. 21, 2015, 7 pages.
Notice of Allowance dated Nov. 16, 2018, issued in connection with U.S. Appl. No. 15/245,569, filed on Aug. 24, 2016, 7 pages.
Notice of Allowance dated Oct. 21, 2015, issued in connection with U.S. Appl. No. 14/042,098, filed on Sep. 30, 2013, 17 pages.
Notice of Allowance dated May 23, 2014, issued in connection with U.S. Appl. No. 13/212,889, filed on Aug. 18, 2011, 14 pages.
Notice of Allowance dated Mar. 25, 2019, issued in connection with U.S. Appl. No. 15/245,591, filed on Aug. 24, 2016, 5 pages.
Notice of Allowance dated Sep. 25, 2018, issued in connection with U.S. Appl. No. 15/245,616, filed on Aug. 24, 2016, 9 pages.
Notice of Allowance dated May 26, 2011, issued in connection with U.S. Appl. No. 10/845,805, filed on May 15, 2004, 14 pages.
Notice of Allowance dated Oct. 29, 2018, issued in connection with U.S. Appl. No. 15/245,501, filed on Aug. 24, 2016, 5 pages.
Notice of Allowance dated Jan. 8, 2019, issued in connection with U.S. Appl. No. 14/977,597, filed on Dec. 21, 2015, 7 pages.
Notice of Incomplete Re-Exam Request dated May 25, 2017, issued in connection with U.S. Appl. No. 90/013,959 , filed on Apr. 1, 2016, 10 pages.
Office Action in Ex Parte Reexamination dated Oct. 20, 2017, issued in connection with U.S. Appl. No. 90/013,959, filed on Jun. 16, 2017, 50 pages.
Palm, Inc., "Handbook for the Palm VII Handheld," May 2000, 311 pages.
Parasound Zpre2 Zone Preamplifier with PTZI Remote Control, 2005, 16 pages.
Pillai et al., "A Method to Improve the Robustness of MPEG Video Applications over Wireless Networks," Kent Ridge Digital Labs, 2000, 15 pages.
Presentations at WinHEC 2000, May 2000, 138 pages.
Proficient Audio Systems M6 Quick Start Guide, 2011, 5 pages.
Proficient Audio Systems: Proficient Editor Advanced Programming Guide, 2007, 40 pages.
Programming Interface for WL54040 Dual-Band Wireless Transceiver, AVAGO0066, Agere Systems, May 2004, 16 pages.
Radio Shack, "Auto-Sensing 4-Way Audio/Video Selector Switch," 2004, 1 page.

(56) References Cited

OTHER PUBLICATIONS

RadioShack, Pro-2053 Scanner, 2002 Catalog, part 1, 100 pages.
RadioShack, Pro-2053 Scanner, 2002 Catalog, part 2, 100 pages.
RadioShack, Pro-2053 Scanner, 2002 Catalog, part 3, 100 pages.
RadioShack, Pro-2053 Scanner, 2002 Catalog, part 4, 100 pages.
RadioShack, Pro-2053 Scanner, 2002 Catalog, part 5, 46 pages.
Rangan et al., "Feedback Techniques for Continuity and Synchronization in Multimedia Information Retrieval," ACM Transactions on Information Systems, 1995, pp. 145-176, vol. 13, No. 2.
Real Time Control Protocol (RTCP) and Realtime Transfer Protocol (RTP), RFC 1889 (Jan. 1996) (D+M_0397810-84) (75 pages).
Sonos, Inc. v. D&M Holdings Inc. et al., Defendant's Amended Invalidity Contentions Exhibit 5: Defendants' Invalidity Contentions for U.S. Pat. No. 8,938,637 filed Sep. 27, 2016, 213 pages.
Sonos, Inc. v. D&M Holdings Inc. et al., Defendant's Amended Invalidity Contentions Exhibit 6: Defendants' Invalidity Contentions for U.S. Pat. No. 9,042,556 filed Sep. 27, 2016, 162 pages.
Sonos, Inc. v. D&M Holdings Inc. et al., Defendant's Amended Invalidity Contentions Exhibit 7: Defendants' Invalidity Contentions for U.S. Pat. No. 9,195,258 filed Sep. 27, 2016, 418 pages.
Sonos, Inc. v. D&M Holdings Inc. et al., Defendant's Amended Invalidity Contentions Exhibit 8: Defendants' Invalidity Contentions for U.S. Pat. No. 9,202,509 filed Sep. 27, 2016, 331 pages.
Sonos, Inc. v. D&M Holdings Inc. et al., Defendant's Amended Invalidity Contentions Exhibit 9: Defendants' Invalidity Contentions for U.S. Pat. No. 9,213,357 filed Sep. 27, 2016, 251 pages.
Sonos, Inc. v. D&M Holdings Inc. et al., Defendant's Initial Invalidity Contentions Exhibit 1: Defendants' Invalidity Contentions for U.S. Pat. No. 7,571,014 filed Apr. 15, 2016, 161 pages.
Sonos, Inc. v. D&M Holdings Inc. et al., Defendant's Initial Invalidity Contentions Exhibit 10: Defendants' Invalidity Contentions for U.S. Pat. No. 9,213,357 filed Apr. 15, 2016, 244 pages.
Sonos, Inc. v. D&M Holdings Inc. et al., Defendant's Initial Invalidity Contentions Exhibit 11: Defendants' Invalidity Contentions for U.S. Pat. No. 9,219,959 filed Apr. 15, 2016, 172 pages.
Sonos, Inc. v. D&M Holdings Inc. et al., Defendant's Initial Invalidity Contentions Exhibit 12: Defendants' Invalidity Contentions for U.S. Pat. No. D559,197 filed Apr. 15, 2016, 36 pages.
Sonos, Inc. v. D&M Holdings Inc. et al., Defendant's Initial Invalidity Contentions Exhibit 2: Defendants' Invalidity Contentions for U.S. Pat. No. 8,588,949 filed Apr. 15, 2016, 112 pages.
Sonos, Inc. v. D&M Holdings Inc. et al., Defendant's Initial Invalidity Contentions Exhibit 3: Defendants' Invalidity Contentions for U.S. Pat. No. 8,843,224 filed Apr. 15, 2016, 118 pages.
Sonos, Inc. v. D&M Holdings Inc. et al., Defendant's Initial Invalidity Contentions Exhibit 4: Defendants' Invalidity Contentions for U.S. Pat. No. 8,938,312 filed Apr. 15, 2016, 217 pages.
Sonos, Inc. v. D&M Holdings Inc. et al., Defendant's Initial Invalidity Contentions Exhibit 5: Defendants' Invalidity Contentions for U.S. Pat. No. 8,938,637 filed Apr. 15, 2016, 177 pages.
Sonos, Inc. v. D&M Holdings Inc. et al., Defendant's Initial Invalidity Contentions Exhibit 6: Defendants' Invalidity Contentions for U.S. Pat. No. 9,042,556 filed Apr. 15, 2016, 86 pages.
Sonos, Inc. v. D&M Holdings Inc. et al., Defendant's Initial Invalidity Contentions Exhibit 7: Defendants' Invalidity Contentions for U.S. Pat. No. 9,130,771 filed Apr. 15, 2016, 203 pages.
Sonos, Inc. v. D&M Holdings Inc. et al., Defendant's Initial Invalidity Contentions Exhibit 8: Defendants' Invalidity Contentions for U.S. Pat. No. 9,195,258 filed Apr. 15, 2016, 400 pages.
Sonos, Inc. v. D&M Holdings Inc. et al., Defendant's Initial Invalidity Contentions Exhibit 9: Defendants' Invalidity Contentions for U.S. Pat. No. 9,202,509 filed Apr. 15, 2016, 163 pages.
Sonos, Inc. v. D&M Holdings Inc. et al., Defendant's Preliminary Identification of Prior Art References, provided Jul. 29, 2016, 5 pages.
Sonos, Inc. v. D&M Holdings Inc. et al., Defendants' Brief in Support of their Motion for Leave to Amend their Answer to Add the Defense of Inequitable Conduct, provided Oct. 12, 2016, 24 pages.
Sonos, Inc. v. D&M Holdings Inc. et al., Defendants' Opposition to Sonos's Motion to Strike Defendants' New Amended Answer Submitted with their Reply, provided Oct. 3, 2016, 15 pages.
Sonos, Inc. v. D&M Holdings Inc. et al., Exhibit A: Defendants' Second Amended Answer to Plaintiffs' Third Amended Complaint, provided Oct. 12, 2016, 43 pages.
Sonos, Inc. v. D&M Holdings Inc. et al., Exhibit B: Defendants' Second Amended Answer to Plaintiffs' Third Amended Complaint, provided Oct. 12, 2016, 43 pages.
Sonos, Inc. v. D&M Holdings Inc. et al., Opening Brief in Support of Defendants' Motion for Leave to Amend Their Answer to Add the Defense of Inequitable Conduct, provided Aug. 1, 2016, 11 pages.
Sonos, Inc. v. D&M Holdings Inc. et al., Order, provided Oct. 7, 2016, 2 pages.
Sonos, Inc. v. D&M Holdings Inc. et al., Plaintiff's Opposition to Defendants' Motion for Leave to Amend Their Answer to Add the Defense of Inequitable Conduct, provided Aug. 26, 2016, 25 pages.
Sonos, Inc. v. D&M Holdings Inc. et al., Redlined Exhibit B: Defendants' First Amended Answer to Plaintiffs' Third Amended Complaint, provided Aug. 1, 2016, 27 pages.
Sonos, Inc. v. D&M Holdings, DI 206-1, Transcript of 101 Hearing (Nov. 28, 2016) (28 pages).
Sonos, Inc. v. D&M Holdings, DI 207, Public Joint Claim Construction Brief (Nov. 30, 2016) (88 pages).
Sonos, Inc. v. D&M Holdings, DI 214, D&M Post-Markman Letter (Dec. 22, 2016) (13 pages).
Sonos, Inc. v. D&M Holdings, DI 215, Sonos Post-Markman Letter (Dec. 22, 2016) (15 pages).
Sonos, Inc. v. D&M Holdings, DI 219, Claim Construction Opinion (Jan. 12, 2017) (24 pages).
Sonos, Inc. v. D&M Holdings, DI 221, Claim Construction Order (Jan. 18, 2017) (2 pages).
Sonos, Inc. v. D&M Holdings, Markman Hearing Transcript (Dec. 14, 2016) (69 pages).
Sony: AIR-SA 50R Wireless Speaker, Copyright 2009, 2 pages.
Sony: Altus Quick Setup Guide ALT-SA32PC, Copyright 2009, 2 pages.
Sony: BD/DVD Home Theatre System Operating Instructions for BDV-E300, E301 and E801, Copyright 2009, 115 pages.
Sony: BD/DVD Home Theatre System Operating Instructions for BDV-IT1000/BDV-IS1000, Copyright 2008, 159 pages.
Sony: Blu-ray Disc/DVD Home Theatre System Operating Instructions for BDV-IZ1000W, Copyright 2010, 88 pages.
Sony: DVD Home Theatre System Operating Instructions for DAV-DZ380W/DZ680W/DZ880W, Copyright 2009, 136 pages.
Sony: DVD Home Theatre System Operating Instructions for DAV-DZ870W, Copyright 2008, 128 pages.
Sony Ericsson MS500 User Guide, Copyright 2009, 2 pages.
Sony: Home Theatre System Operating Instructions for HT-IS100, Copyright 2008, 168 pages.
Sony: HT-IS100, 5.1 Channel Audio System, last updated Nov. 2009, 2 pages.
Sony: Multi Channel AV Receiver Operating Instructions, 2007, 80 pages.
Sony: Multi Channel AV Receiver Operating Instructions for STR-DN1000, Copyright 2009, 136 pages.
Sony: STR-DN1000, Audio Video Receiver, last updated Aug. 2009, 2 pages.
Sony: Wireless Surround Kit Operating Instructions for WHAT-SA2, Copyright 2010, 56 pages.
Taylor, Marilou, "Long Island Sound," Audio Video Interiors, Apr. 2000, 8 pages.
Toa Corporation, Digital Processor DP-0206 DACsys2000 Version 2.00 Software Instruction Manual, Copyright 2001, 67 pages.
Understanding Universal Plug and Play, Microsoft White Paper (Jun. 2000) (D+M_0402074-118) (45 pages).
Realtime Streaming Protocol (RTSP), RFC 2326 (Apr. 1998) (D+M_0397945-8036) (92 pages).
Realtime Transport Protocol (RTP), RFC 3550 (Jul. 2003) (D+M_0398235-323) (89 pages).

(56) References Cited

OTHER PUBLICATIONS

Reid, Mark, "Multimedia conferencing over ISDN and IP networks using ITU-T H-series recommendations: architecture, control and coordination," Computer Networks, 1999, pp. 225-235, vol. 31.
RenderingControl:1 Service Template Version 1.01 for UPnP, Version 1.0, (Jun. 25, 2002) (SONDM000115187-249) (63 pages).
Renewed Request for Ex Parte Re-Examination, U.S. Appl. No. 90/013,959, filed Jun. 16, 2017, 126 pages.
"Residential Distributed Audio Wiring Practices," Leviton Network Solutions, 2001, 13 pages.
Rothermel et al., "An Adaptive Protocol for Synchronizing Media Streams," Institute of Parallel and Distributed High-Performance Systems (IPVR), 1997, 26 pages.
Rothermel et al., "An Adaptive Stream Synchronization Protocol," 5th International Workshop on Network and Operating System Support for Digital Audio and Video, Apr. 18-21, 1995, 12 pages.
Rothermel et al., "Synchronization in Joint-Viewing Environments," University of Stuttgart Institute of Parallel and Distributed High-Performance Systems, 1992, 13 pages.
"RVL-6 Modular Multi-Room Controller, Installation & Operation Guide," Nile Audio Corporations, 1999, 46 pages.
Simple Network Time Protocol (SNTPI), RFC 1361 (Aug. 1992) (D+M_0397537-46) (10 pages).
Simple Network Time Protocol (SNTPII), RFC 1769 (Mar. 1995) (D+M_0397663-76) (14 pages).
Simple Service Discovery Protocol/1.0 Operating without an Arbiter (Oct. 28, 1999) (24 pages).
Sonos, Inc. v D&M Holdings, D&M Supp Opposition Brief including Exhibits, Mar. 17, 2017, 23 pages.
Sonos, Inc. v. D&M Holdings, Expert Report of Jay P. Kesan including Appendices A-P, Feb. 20, 2017, 776 pages.
Sonos, Inc. v. D&M Holdings Inc. et al., Complaint for Patent Infringement, filed Oct. 21, 2014, 20 pages.
Sonos, Inc. v. D&M Holdings Inc. et al., Defendant's Amended Invalidity Contentions, filed Sep. 14, 2016, 100 pages.
Sonos, Inc. v. D&M Holdings Inc. et al., Defendant's Initial Invalidity Contentions, filed Apr. 15, 2016, 97 pages.
Sonos, Inc. v. D&M Holdings Inc. et al., Defendant's Preliminary Identification of Indefinite Terms, provided Jul. 29, 2016, 8 pages.
Sonos, Inc. v. D&M Holdings Inc. et al., Defendants' 35 U.S.C. § 282 Notice filed Nov. 2, 2017, 31 pages.
Sonos, Inc. v. D&M Holdings Inc. et al., Defendants' Amended Answer, Defenses, and Counterclaims for Patent Infringement, filed Nov. 30, 2015, 47 pages.
Sonos, Inc. v. D&M Holdings Inc. et al., Defendants' Answer to Plaintiff's Second Amended Complaint, filed Apr. 30, 2015, 19 pages.
Sonos, Inc. v. D&M Holdings Inc. et al., Defendants' First Amended Answer to Plaintiffs' Third Amended Complaint, filed Sep. 7, 2016, 23 pages.
Sonos, Inc. v. D&M Holdings Inc. et al., Defendants' Reply in Support of Partial Motion for Judgment on the Pleadings, filed Jun. 10, 2016, 15 pages.
Sonos, Inc. v. D&M Holdings Inc. et al., Exhibit A: Defendants' First Amended Answer to Plaintiffs' Third Amended Complaint, provided Aug. 1, 2016, 26 pages.
Sonos, Inc. v. D&M Holdings Inc. et al., Exhibit A: Defendants' Second Amended Answer to Plaintiffs' Third Amended Complaint, filed Sep. 9, 2016, 43 pages.
Sonos, Inc. v. D&M Holdings Inc. et al., Exhibit A: Defendants' Second Amended Answer to Plaintiffs' Third Amended Complaint, provided Sep. 9, 2016, 88 pages.
Sonos, Inc. v. D&M Holdings Inc. et al., First Amended Complaint for Patent Infringement, filed Dec. 17, 2014, 26 pages.
Sonos, Inc. v. D&M Holdings Inc. et al., Joint Claim Construction Chart, vol. 1 of 3 with Exhibits A-O, filed Aug. 17, 2016, 30 pages.
Sonos, Inc. v. D&M Holdings Inc. et al., Opening Brief in Support of Defendants' Partial Motion for Judgment on the Pleadings for Lack of Patent-Eligible Subject Matter, filed May 6, 2016, 27 pages.
Sonos, Inc. v. D&M Holdings Inc. et al., Plaintiff Sonos, Inc.'s Opening Claim Construction Brief, filed Sep. 9, 2016, 26 pages.
Sonos, Inc. v. D&M Holdings Inc. et al., Plaintiff Sonos, Inc.'s Response in Opposition to Defendants' Partial Motion for Judgment on the Pleadings, filed May 27, 2016, 24 pages.
Sonos, Inc. v. D&M Holdings Inc. et al., Reply Brief in Support of Defendants' Motion for Leave to Amend their Answer to Add the Defense of Inequitable Conduct, provided Nov. 10, 2016, 16 pages.
Sonos, Inc. v. D&M Holdings Inc. et al., Reply Brief in Support of Defendants' Motion for Leave to Amend their Answer to Add the Defense of Inequitable Conduct, provided Sep. 9, 2016, 16 pages.
Sonos, Inc. v. D&M Holdings Inc. et al., Second Amended Complaint for Patent Infringement, filed Feb. 27, 2015, 49 pages.
Sonos, Inc. v. D&M Holdings Inc. et al., Sonos's Motion to Strike Defendants' New Amended Answer Submitted with their Reply Brief, provided Sep. 15, 2016, 10 pages.
Sonos, Inc. v. D&M Holdings Inc. et al., Sonos's Opposition to Defendants' Motion for Leave to Amend their Answer to Add the Defense of Inequitable Conduct, provided Oct. 31, 2016, 26 pages.
Sonos, Inc. v. D&M Holdings Inc. et al., Third Amended Complaint for Patent Infringement, filed Jan. 29, 2016, 47 pages.
Sonos, Inc. v. D&M Holdings, Inc. , Defendants' Final Invalidity Contentions (Jan. 18, 2017) (106 pages).
Sonos, Inc. v. D&M Holdings , DI 226, Opinion Denying Inequitable Conduct Defenses, Feb. 6, 2017, updated, 5 pages.
Sonos, Inc. v. D&M Holdings , DI 242, US District Judge Andrews 101 Opinion, Mar. 13, 2017, 16 pages.
Sonos, Inc. v D&M Holdings, Sonos Supp Opening Markman Brief including Exhibits, Mar. 3, 2017, 17 pages.
Sonos, Inc. v. D&M Holdings, Sonos Supp Reply Markman Brief including Exhibits, Mar. 29, 2017, 36 pages.
Sonos, Inc. v. D&M Holdings Inc. et al., Declaration of Steven C. Visser, executed Sep. 9, 2016, 40 pages.
Sonos, Inc. v. D&M Holdings Inc. et al., Defendant's Amended Invalidity Contentions Exhibit 1: Defendants' Invalidity Contentions for U.S. Pat. No. 7,571,014 filed Sep. 16, 2016, 270 pages.
Sonos, Inc. v. D&M Holdings Inc. et al., Defendant's Amended Invalidity Contentions Exhibit 10: Defendants' Invalidity Contentions for U.S. Pat. No. 9,219,959 filed Sep. 27, 2016, 236 pages.
Sonos, Inc. v. D&M Holdings Inc. et al., Defendant's Amended Invalidity Contentions Exhibit 11: Defendants' Invalidity Contentions for U.S. Pat. No. D559,197 filed Sep. 27, 2016, 52 pages.
Sonos, Inc. v. D&M Holdings Inc. et al., Defendant's Amended Invalidity Contentions Exhibit 2: Defendants' Invalidity Contentions for U.S. Pat. No. 8,588,949 filed Sep. 27, 2016, 224 pages.
Sonos, Inc. v. D&M Holdings Inc. et al., Defendant's Amended Invalidity Contentions Exhibit 3: Defendants' Invalidity Contentions for U.S. Pat. No. 8,843,224 filed Sep. 27, 2016, 147 pages.
Sonos, Inc. v. D&M Holdings Inc. et al., Defendant's Amended Invalidity Contentions Exhibit 4: Defendants' Invalidity Contentions for U.S. Pat. No. 8,938,312 filed Sep. 27, 2016, 229 pages.
Sonos, Inc. v. Implicit, LLC: Declaration of Roman Chertov in Support of the Inter Partes Review of U.S. Pat. No. 7,391,791 dated Mar. 9, 2018, 92 pages.
Sonos, Inc. v. Implicit, LLC: Declaration of Roman Chertov in Support of the Inter Partes Review of U.S. Pat. No. 8,942,252 dated Mar. 9, 2018, 81 pages.
Sonos, Inc. v. Lenbrook Industries Limited et al., Defendants' Answer to Plaintiff's Complaint—Exhibit A, filed Oct. 14, 2019, 3 pages.
Sonos, Inc. v. Lenbrook Industries Limited et al., Defendants' Answer to Plaintiff's Complaint—Exhibit C, filed Oct. 14, 2019, 16 pages.
Sonos, Inc. v. Lenbrook Industries Limited et al., Defendants' Answer to Plaintiff's Complaint—Exhibit D, filed Oct. 14, 2019, 36 pages.
Sonos, Inc. v. Lenbrook Industries Limited et al., Defendants' Answer to Plaintiff's Complaint—Exhibit E, filed Oct. 14, 2019, 21 pages.
Sonos, Inc. v. Lenbrook Industries Limited et al., Defendants' Answer to Plaintiff's Complaint, filed Oct. 14, 2019, 66 pages.

(56) References Cited

OTHER PUBLICATIONS

*Sonos, Inc. v. Lenbrook Industries Limited et al.*, Defendants' First Amended Answer and Counterclaims to Plaintiff's Complaint, filed Nov. 14, 2019, 66 pages.
"884+ Automatic Matrix Mixer Control System," Ivie Technologies, Inc., 2000, pp. 1-4.
Advanced Driver Tab User Interface WaveLan GUI Guide, AVAGO0009, Agere Systems, Feb. 2004, 4 pages.
Advisory Action dated Feb. 2, 2018, issued in connection with U.S. Appl. No. 14/977,612, filed on Dec. 12, 2015, 3 pages.
Advisory Action dated Jul. 25, 2018, issued in connection with U.S. Appl. No. 15/245,616, filed on Aug. 24, 2016, 3 pages.
Advisory Action dated Dec. 26, 2017, issued in connection with U.S. Appl. No. 14/977,597, filed on Dec. 21, 2015, 3 pages.
Advisory Action dated Feb. 6, 2018, issued in connection with U.S. Appl. No. 15/245,501, filed on Aug. 24, 2016, 3 pages.
Agere Systems' Voice-over-Wireless LAN (VoWLAN) Station Quality of Service, AVAGO0015, Agere Systems, Jan. 2005, 5 pages.
Akyildiz et al., "Multimedia Group Synchronization Protocols for Integrated Services Networks," IEEE Journal on Selected Areas in Communications, 1996 pp. 162-173, vol. 14, No. 1.
Audio Authority: How to Install and Use the Model 1154 Signal Sensing Auto Selector, 2002, 4 pages.
Audio Authority: Model 1154B High Definition AV Auto Selector, 2008, 8 pages.
AudioSource: AMP 100 User Manual, 2003, 4 pages.
AudioTron Quick Start Guide, Version 1.0, Mar. 2001, 24 pages.
AudioTron Reference Manual, Version 3.0, May 2002, 70 pages.
AudioTron Setup Guide, Version 3.0, May 2002, 38 pages.
Automatic Profile Hunting Functional Description, AVAGO0013, Agere Systems, Feb. 2004, 2 pages.
"A/V Surround Receiver AVR-5800," Denon Electronics, 2000, 2 pages.
"A/V System Controleer, Owner's Manual," B&K Compontents, Ltd., 1998, 52 pages.
AVTransport:1 Service Template Version 1.01 for UPnP, Version 1.0 (Jun. 25, 2002) (66 pages).
Axis Communication: Axis P8221 Network I/O Audio Module, 2009, 41 pages.
Balfanz et al., "Network-in-a-Box: How to Set Up a Secure Wireless Network in Under a Minute," 13th USENIX Security Symposium—Technical Paper, 2002, 23 pages.
Balfanz et al., "Talking to Strangers: Authentication in Ad-Hoc Wireless Networks," Xerox Palo Alto Research Center, 2002, 13 pages.
Barham et al., "Wide Area Audio Synchronisation," University of Cambridge Computer Laboratory, 1995, 5 pages.
Bluetooth. "Specification of the Bluetooth System: The ad hoc SCATTERNET for affordable and highly functional wireless connectivity," Core, Version 1.0 A, Jul. 26, 1999, 1068 pages.
Bluetooth. "Specification of the Bluetooth System: Wireless connections made easy," Core, Version 1.0 B, Dec. 1, 1999, 1076 pages.
Bogen Communications, Inc., ProMatrix Digitally Matrixed Amplifier Model PM3180, Copyright1996, 2 pages.
Brassil et al., "Enhancing Internet Streaming Media with Cueing Protocols," 2000, 9 pages.
Breebaart et al., "Multi-Channel Goes Mobile: MPEG Surround Binaural Rendering," AES 29th International Conference, Sep. 2-4, 2006, pp. 1-13.
Cen et al., "A Distributed Real-Time MPEG Video Audio Player," Department of Computer Science and Engineering, Oregon Graduate Institute of Science and Technology, 1995, 12 pages.
Change Notification: Agere Systems WaveLan Multimode Reference Design (D2 to D3), AVAGO0042, Agere Systems, Nov. 2004, 2 pages.
Connection Manager: 1 Service Template Version 1.01 for UPnP, Version 1.0 (Jun. 25, 2002) (25 pages).
ContentDirectory:1 Service Template Version 1.01 for UPnP, Version 1.0 (Jun. 25, 2002) (89 pages).

Corrected Notice of Allowability dated Jan. 6, 2016, issued in connection with U.S. Appl. No. 14/465,417, filed on Aug. 21, 2014, 3 pages.
Corrected Notice of Allowability dated Dec. 22, 2015, issued in connection with U.S. Appl. No. 14/486,648, filed on Sep. 15, 2014, 3 pages.
Dannenberg et al., "A. System Supporting Flexible Distributed Real-Time Music Processing," Proceedings of the 2001 International Computer Music Conference, 2001, 4 pages.
Dannenberg, Roger B., "Remote Access to Interactive Media," Proceedings of the SPIE 1785, 1993, pp. 230-237.
Day, Rebecca, "Going Elan!" Primedia Inc., 2003, 4 pages.
Decker et al., "RFC 1493, Definitions of Managed Objects for Bridges," Network Working Group, Jul. 1993, 35 pages.
Deep-Sleep Implementation in WL60011 for IEEE 802.11b Applications, AVAGO0020, Agere Systems, Jul. 2004, 22 pages.
Dell, Inc. "Dell Digital Audio Receiver: Reference Guide," Jun. 2000, 70 pages.
Dell, Inc. "Start Here," Jun. 2000, 2 pages.
"Denon 2003-2004 Product Catalog," Denon, 2003-2004, 44 pages.
Denon AV Surround Receiver AVR-1604/684 User's Manual, 2004, 128 pages.
Denon AV Surround Receiver AVR-5800 Operating Instructions, Copyright 2000, 67 pages.
Designing a UPnP AV MediaServer, Nelson Kidd (2003) (SONDM000115062-116) (55 pages).
"DP-0206 Digital Signal Processor," TOA Electronics, Inc., 2001, pp. 1-12.
Faller, Christof, "Coding of Spatial Audio Compatible with Different Playback Formats," Audio Engineering Society Convention Paper (Presented at the 117th Convention), Oct. 28-31, 2004, 12 pages.
Final Office Action dated Feb. 4, 2011, issued in connection with U.S. Appl. No. 10/845,805, filed on May 15, 2004, 18 pages.
Final Office Action dated Oct. 4, 2017, issued in connection with U.S. Appl. No. 14/977,597, filed on Dec. 21, 2015, 15 pages.
Final Office Action dated Sep. 5, 2008, issued in connection with U.S. Appl. No. 10/845,805, filed on May 15, 2004, 17 pages.
Final Office Action dated Nov. 15, 2007, issued in connection with U.S. Appl. No. 10/845,805, filed on May 15, 2004, 15 pages.
AudioPoint from Home Director. Play Digital Music on Your Conventional Stereo System, 2002, 2 pages.
AudioPoint, Welcome to the coolest way to listen to digital music over your conventional stereo equipment, Home Director HD00B02, 2002, 2 pages.
Barix Download Exstreamer Software. Accessed via WayBack Machine, Apr. 6, 2003. http://www.barix.com/estreamer/software.download.html. 2 pages.
Barix. Exstreamer Datasheet. Accessed via WayBack Machine, Apr. 2, 2003. http://www.barix.com/exstreamer/, 1 page.
Crest Audio Pro Series 8001 Power Amplifier. V. 2.2 Mar. 25, 1997, 2 pages.
Davies, Chris. Sony Ericsson MS500 Bluetooth Splashproof Speaker. http://www.slashgear.com/sony-ericsson-ms5006-bluetooth-splashproof. Mar. 17, 2009, 2 pages.
Denon AVR-3805 A/V Surround Receiver. Datasheet, last modified Mar. 1, 2004, 2 pages.
DP-0206 TOA Digital Signal Processor. TOA Corporation, 2001, 4 pages.
Exstreamer. Network MP3 player for digital audio streaming in a consumer, home installation and commercial applications. Barix Think Further. Sep. 2002, 2 pages.
Exstreamer. The Exstreamer Instruction Manual. Barix Think Further. Version 1.5 , Oct. 2002, 21 pages.
Exstreamer. The Exstreamer Technical Description: Version 1.5. Barix Think Further. Oct. 2002, 36 pages.
FireBall Digital Music Manager E-40 and E-120. Meet FireBall. The Industry's choice for managing your entire music collection. Datasheet. 2003, 2 pages.
Fireball E2 User's Manual. Escient. Gracenote cddb. 2000-2004, 106 pages.

(56) References Cited

OTHER PUBLICATIONS

LA Audio ZX135E 6 Zone Expander. Pro Audio Design Pro. Inc. https://www.proaudiodesign.com/products/la-audio-zx135e-6-zone-expander, accessed Mar. 26, 2020, 6 pages.
Model MRC88 Eight Zone—Eight Source Audio/Video Controller/Amplifier System, Xantech Corporation, 2003, 102 pages.
Multi-Zone Control Systems. ZR-8630AV MultiZone Receiver. Niles. http://www.ampersandcom.com/zr8630av.html accessed Mar. 26, 2020, 5 pages.
Structured Media Components. Leviton Integrated Networks, last modified Apr. 10, 2006, 28 pages.
UPnP AV Architecture:0.83 for UPnP Version 1.0, Jun. 12, 2002, copyright 2000, 22 pages.
UPnP Forum. UPnP Device Architecture 1.0. Oct. 15, 2008, 80 pages.
Wireless Home Audio Director. Wireless N Music Player with Integrated Amplifier DMC250. Datasheet. Linksys by Cisco. Fill Your Home with Music, 2008, 2 pages.
Yahoo Groups. Exstreamer. Barix Exstreamer. Access via Wayback Machine http://groups.yahoo.com/group/exstreamer/ Dec. 22, 2013, 1 page.
Yamaha DME Designer 3.0 Owner's Manual; Copyright 2008, 501 pages.

POWER CONTROL BASED ON PACKET TYPE

CROSS-REFERENCE TO RELATED APPLICATIONS

This application is a continuation of application Ser. No. 15/245,591 titled "Power Decrease Based on Packet Type," which was filed on Aug. 24, 2016, and which is currently pending; the Ser. No. 15/245,591 application is a continuation of application Ser. No. 14/977,597 titled "Power Decrease Based on Packet Type," which was filed on Dec. 21, 2015, and was issued on May 28, 2019, as U.S. Pat. No. 10,303,240; the Ser. No. 14/977,597 application is a continuation of application Ser. No. 14/465,417 titled "Method and System for Controlling Amplifiers," which was filed on Aug. 21, 2014, and was issued on Jan. 13, 2016, as U.S. Pat. No. 9,252,721; the Ser. No. 14/465,417 application is a continuation of application Ser. No. 13/212,889 titled "Method and System for Controlling Amplifiers," which was filed on Aug. 18, 2011, and was issued on Sep. 23, 2014, as U.S. Pat. No. 8,843,224; and the Ser. No. 13/212,889 application is a continuation of application Ser. No. 10/845,805 titled "Method and System for Controlling Amplifiers," which was filed on May 15, 2004, and was issued on Sep. 20, 2011, as U.S. Pat. No. 8,024,055. The entire contents of the Ser. No. 15/245,591; Ser. No. 14/977,597; Ser. No. 14/465,417; Ser. No. 13/212,889; and Ser. No. 10/845,805 applications are incorporated herein by reference for all purposes.

BACKGROUND OF THE INVENTION

1. Field of the Invention

The invention is generally related to the area of audio technologies. In particular, the invention is related to controlling of audio amplifiers in devices based upon data traffic detection.

2. The Background of Related Art

Automatic power shutdown is an important feature in many electrical appliances. One of the appliances commonly seen is a stereo system that includes a powered subwoofer. The subwoofer is automatically shutdown when the stereo system is powered off or produces no sound (e.g., in CD mode with no CD is played). On the other end, the subwoofer is automatically tuned on when the stereo system is powered on, thus eliminating the need of turning on or off two devices manually or sequentially. Another example is an uninterruptible power supply (UPS) supporting a computer system. The UPS provides power in an event that regular power to the computer system is suddenly off. As an automated preventative measure, the computer system is configured to shut down itself when the UPS is running on a low battery level or beyond a predetermined time so as to avoid corrupting files, or damaging other parts in the computer system.

The implementation of the automatic power shutdown feature is largely based upon special circuitry or analog control circuits to detect a signal level against a predetermined level. In the stereo system example, if audio signals to the subwoofer are not detected or substantially lower than a fixed level for a period of time, the subwoofer is sent a signal to be powered off. Likewise, when audio signals to the subwoofer are detected, the subwoofer is sent a signal to be powered on. In the UPS example, the detection mechanism is similar. The battery in the UPS is constantly or periodically measured against a predetermined level or the operation time thereof is measured. When either one of the measurements is below a certain level, the computer system receives a signal or an instruction that triggers the automatic shutdown process.

The analog solution of automatic power shutdown is not effective when used in a distributed system comprising multiple devices that need to automatically shut down while not in use. For example, a plurality of networked audio devices each of which has or associated with one or more power amplifiers share audio sources. The detection of an analog signal to one of the audio devices on a data network would be difficult and ineffective. Additional hardware (i.e., circuitry), if needed, would increase the cost and complexity of such system. There is, therefore, a need for solutions of automatic shutdown suitable for such system without adding extra hardware.

SUMMARY OF THE INVENTION

This section is for the purpose of summarizing some aspects of the present invention and to briefly introduce some preferred embodiments. Simplifications or omissions in this section as well as in the abstract or the title of this description may be made to avoid obscuring the purpose of this section, the abstract and the title. Such simplifications or omissions are not intended to limit the scope of the present invention.

In general, the present invention pertains to controlling one or more audio amplifiers in or associated with a device coupled on a local area network and receiving at least one selected source from other devices also coupled on the network. The device may be an audio device for playing back audio resources stored on the other devices. According to one aspect of the present invention, an automatic shutdown control module is provided in the device to power down the audio amplifiers when there is no audio data flow coming to the device or power up the audio amplifiers when there is audio data flow coming to the device.

All types of traffic may be present on a local area network, including data other than those from an audio source. The present invention relies upon traffic of only the data from one or more audio sources to control the operation of audio amplifiers. When audio traffic to a device is absent for a defined time, an audio amplifier in or associated with the device is automatically powered down. The defined time may be a fixed time or derived from a set of data collected over a time period regarding a time lapse not intended for powering down the audio amplifier.

According to another aspect of the present invention, the procedure to power down or power up the amplifiers is in accordance with a hysteresis, wherein the hysteresis, being lagging of an effect behind its cause, protects the amplifiers and makes the powering-down or powering-up procedure unnoticeable to a user. As such, the implementation of the hysteresis protects the amplifiers from being turned on or off in quick succession.

The present invention may be implemented in many forms including software, hardware or a combination of both. According to one embodiment, the present invention is an apparatus for controlling an audio amplifier, the apparatus comprises: a network interface communicating with a data network, a control module, coupled to the network interface, configured to detect any data packets coming from the data network; when none of the data packets is detected relating to an audio source for a defined time, the control module causing the audio amplifier to be powered down; when the data packets is detected relating to an audio source, the control module causing the audio amplifier to be powered on.

According to another embodiment, the present invention is a method for controlling an audio amplifier, the method comprises detecting any data packets coming from a network; when none of the data packets is detected relating to an audio source for a defined time, causing the audio amplifier to be powered down; when the data packets is detected relating to an audio source, causing the audio amplifier to be powered on.

One of the objects, features, advantages of the present invention is to use data traffic pertaining only to the data of the audio source to control audio amplifiers.

Other objects, features, and advantages of the present invention will become apparent upon examining the following detailed description of an embodiment thereof, taken in conjunction with the attached drawings.

BRIEF DESCRIPTION OF THE DRAWINGS

These and other features, aspects, and advantages of the present invention will become better understood with regard to the following description, appended claims, and accompanying drawings where:

DETAILED DESCRIPTION OF THE PREFERRED EMBODIMENT

The present invention pertains to designs of controlling one or more audio amplifiers in or associated with a device coupled on a local area network and receiving at least one selected source from other devices also coupled on the network. The device may be an audio device for playing back audio resources stored on the other devices. According to one aspect of the present invention, an automatic shutdown control module is provided in the device to power down the audio amplifiers when there is no audio data flow coming to the device or power up the audio amplifiers when there is audio data flow coming to the device. In one embodiment, the procedure to power down or power up the amplifiers is in accordance with a hysteresis, wherein the hysteresis, being lagging of an effect behind its cause, protects the amplifiers and makes the powering-down or powering-up procedure unnoticeable to a user.

The detailed description of the present invention is presented largely in terms of procedures, steps, logic blocks, processing, or other symbolic representations that directly or indirectly resemble the operations of devices or systems that can be used in networks. These descriptions and representations are typically used by those skilled in the art to most effectively convey the substance of their work to others skilled in the art.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments. Further, the order of blocks in process flowcharts or diagrams representing one or more embodiments of the invention do not inherently indicate any particular order nor imply any limitations in the invention.

Figure 1:
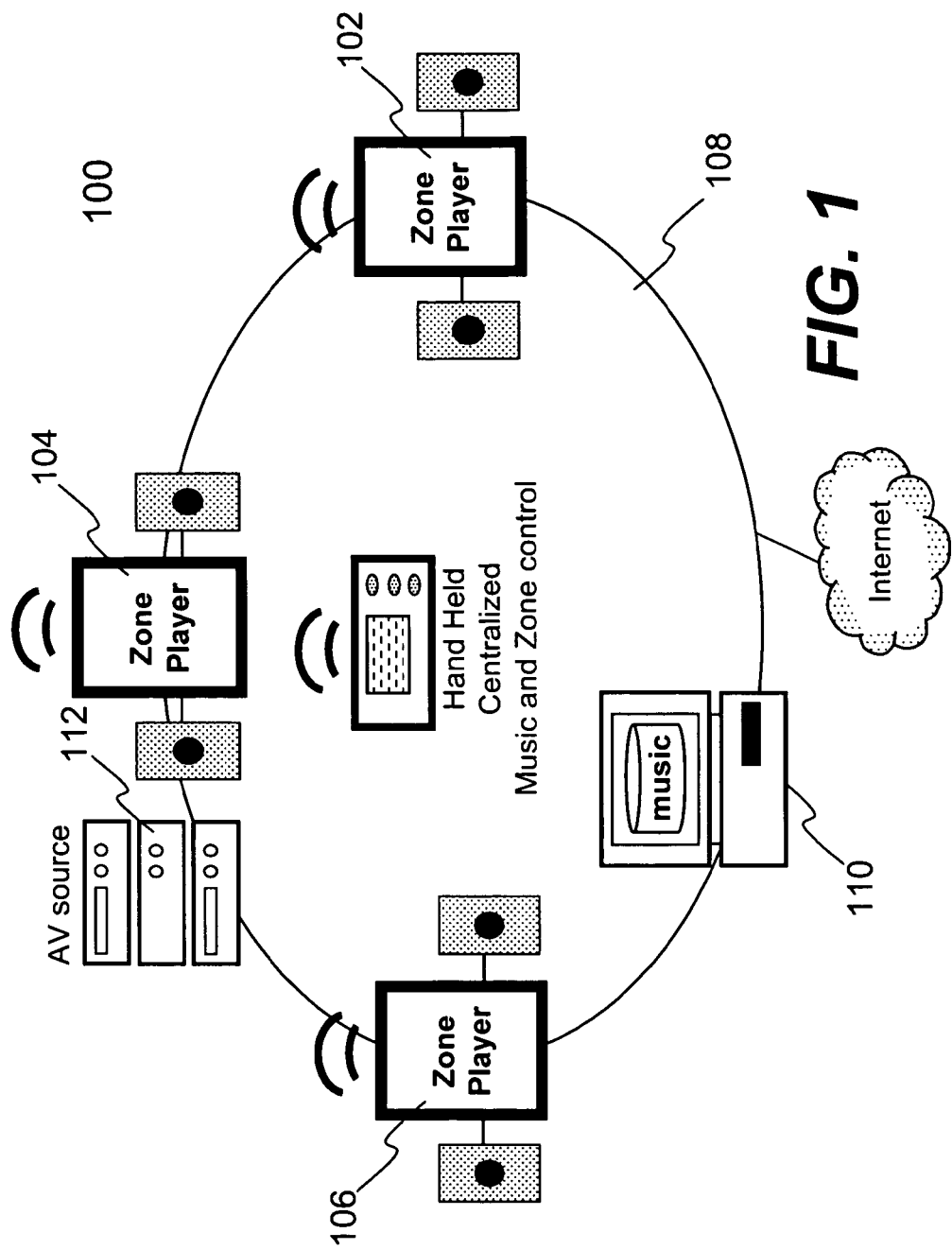
FIG. 1 shows a configuration in which the present invention may be practiced, the configuration may represent, but not be limited to, a part of a residential home, a business building or a complex.

Referring now to the drawings, in which like numerals refer to like parts throughout the several views. FIG. 1 shows an exemplary configuration 100 in which the present invention may be practiced. The configuration may represent, but not be limited to, a part of a residential home, a business building or a complex. There are a number of audio devices of which three exemplas 102, 104 and 106 are shown. Each of the audio devices may be installed or provided in one particular area or zone and hence referred to as a zone player herein.

As used herein, unless explicitly stated otherwise, an audio source or audio sources are in digital format and can be transported over a data network. A term "power down" or "power off" an audio amplifier does not necessarily mean that a power supply to the audio amplifier is completely disconnected and in most cases mean that the audio amplifier operates in a sleeping mode so as to consume a minimum amount of power.

To facilitate the understanding of the present invention, it is assumed that the configuration 100 represents a home. Thus, the zone player 102 and 104 may be in two bedrooms respectively while the zone player 106 may be in a living room. All of the zone players 102, 104 and 106 are coupled to a data network 108. In addition, a computing device 110 is shown to be coupled on the network 108. In reality, any other devices such as a home gateway device, a storage device, or an MP3 player may be coupled to the network 108 as well.

The network 108 may be a wired network, a wireless network or a combination of both. In one example, all devices including the zone players 102, 104 and 106 are coupled to the network 108 by wireless means based on an industry standard such as 802.11 or WiFi. In another example, all devices including the zone players 102, 104 and 106 are part of a local area network that communicate with a wide area network (e.g., the Internet).

Many devices on the network 108 are configured to download and store audio sources. For example, the computing device 110 can download audio sources from the Internet and store the downloaded sources locally for sharing with other devices on the Internet or the network 108. The computing device 110 can also be configured to receive streaming audios. Shown as a stereo system, the device 112 is configured to convert an analog source (e.g., from broadcasting) to a digital audio source or retrieve an audio source (e.g., from a compact disk). In accordance with the present invention, the audio source may be shared among the devices on the network 108. Although each of the zone players may be configured to be able to download or store audio resources, the following description is based on the assumption that the zone players are pure players and need to retrieve selected audio sources from other devices (e.g., the compute system 110) for playback.

Figure 2A:
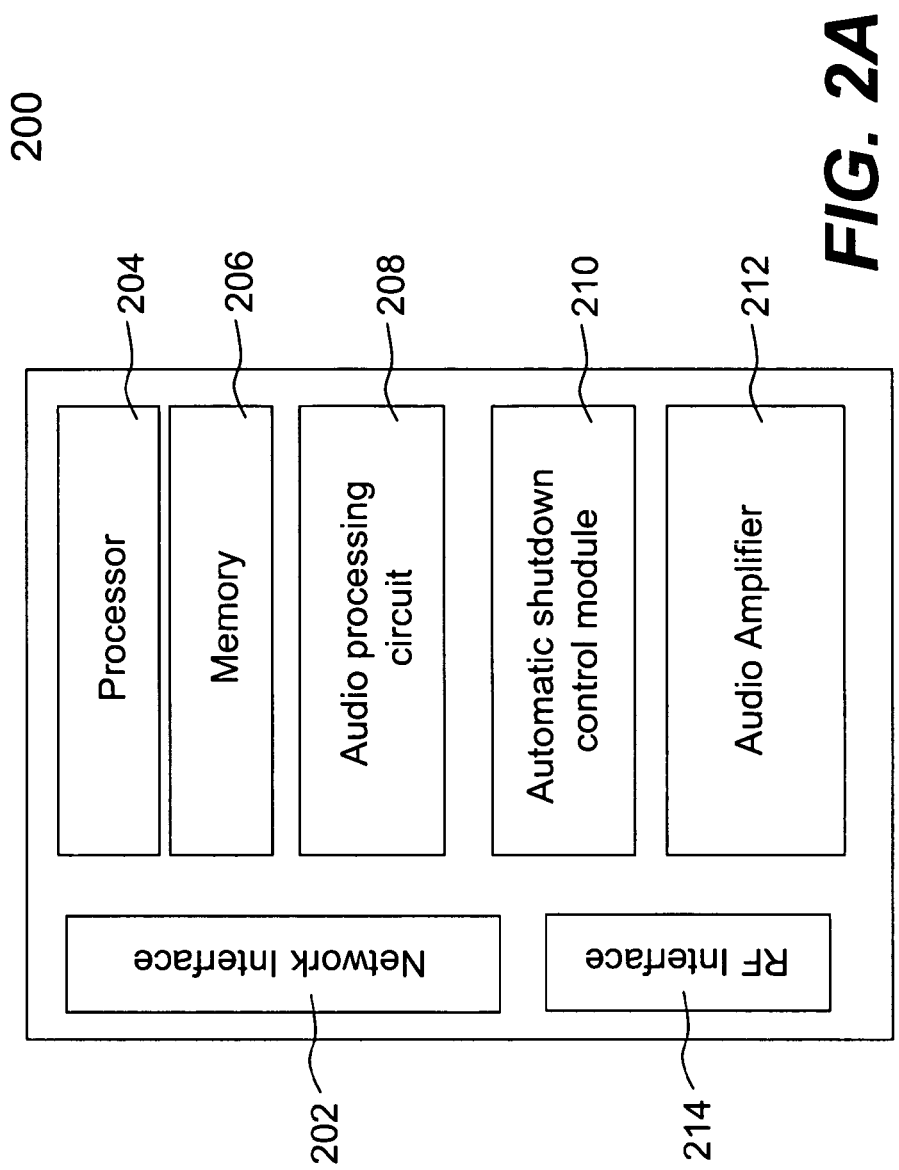
FIG. 2A shows an exemplary functional block diagram of a zone player in accordance with the present invention.

FIG. 2A shows an exemplary functional block diagram of a zone player 200 in accordance with the present invention. The zone player 200 includes a network interface 202, a processor 204, a memory 206, an audio processing circuit 208, an automatic shutdown control module 210, and an audio amplifier 212. The audio amplifier 212 may represent multiple amplifiers. The network interface 202 facilitates a data flow between a data network (i.e., the data network 108 of FIG. 1) and the zone player 200 and typically executes a special set of rules (i.e., a protocol) to send data back and forth. One of the common protocols is TCP/IP (Transmission Control Protocol/Internet Protocol) commonly used in the Internet. In general, a network interface manages the assembling of an audio source or file into smaller packets that are transmitted over the data network or reassembles received packets into the original source or file. In addition, the network interface 202 handles the address part of each packet so that it gets to the right destination or intercepts packets destined for the zone player 200.

Figure 2B:
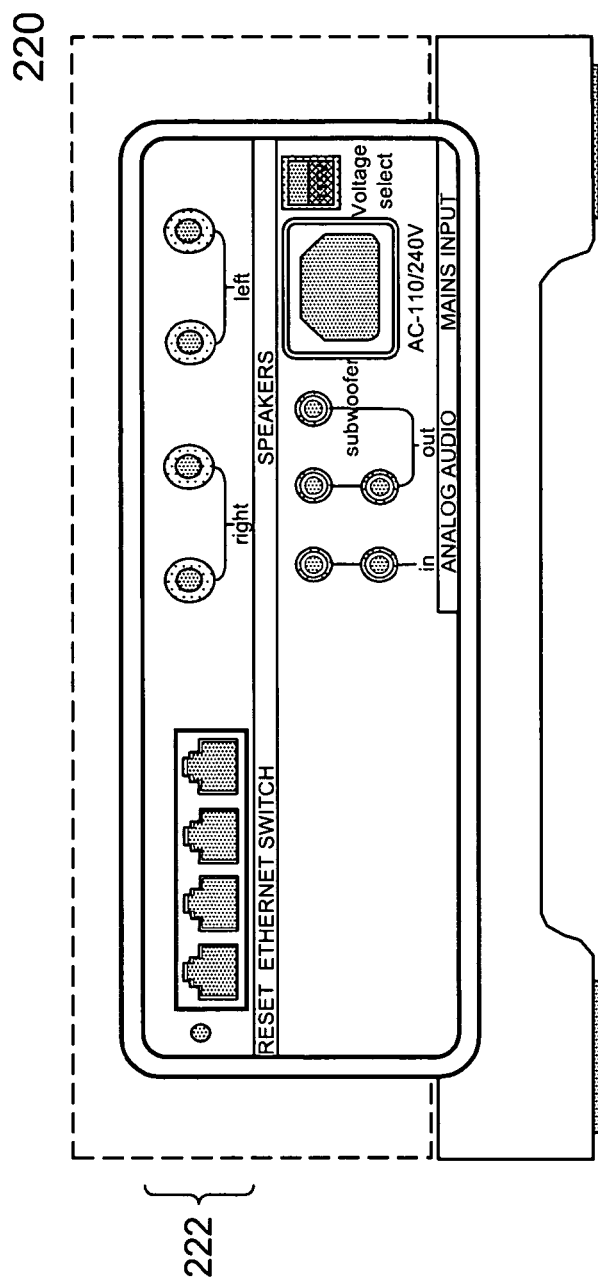
FIG. 2B shows an exemplary panel configuration of a zone player according to one embodiment of the present invention.

FIG. 2B shows an exemplary panel configuration 220 of the zone player 200 according to one embodiment of the present invention. It can be appreciated by those skilled in the art that, the zone player 200 is configured to be able to communicate with other devices via the data ports 222 and share the audio sources with other zone players. In particular, the data ports 222 allow the zone player 200 to retrieve a selected song or a selected piece of music from a device on the network 108.

The processor 204 is configured to control the operation of other parts in the zone player 200. The memory 206 may be loaded with software modules that can be executed by the processor 204 to achieve desired tasks. According to one aspect of the present invention, a software module implementing one embodiment of the present invention is executed, the automatic shutdown control module operates in accordance with the software module to control the operation of the audio amplifier 212 so as to turn the audio amplifier 212 off when the zone player 200 is not in use or turn the audio amplifier 212 on when the zone player 200 is to play back a selected audio source.

The audio processing circuit 208 resembles most of the circuitry in an audio playback device and includes one or more digital-to-analog converters (DAC), an audio preprocessing part, an audio enhancement part or a digital signal processor and others. In operation, when an audio source is retrieved via the network interface 202, the audio source is processed in the audio processing circuit 208 to produce analog audio signals. The processed analog audio signals are then provided to the audio amplifier 212 for playback on nearby speakers.

The audio amplifier 212 is typically an analog circuit that powers the provided analog audio signals to drive one or more speakers. The audio amplifier 212, which may be a separate unit outside of the zone player 200, is a primary source to draw most of the power to drive the system. Prolonged operation of the audio amplifier 212 without actually amplifying anything, namely when no analog audio signals are provided, is not desirable. Leaving the audio amplifier 212 on, even if it is not actually in use, consumes the power, shortens the operating life thereof, and may generate excessive heat that can cause damage to nearby parts. In other words, it is desired at all times that the audio amplifier 212 is powered down when the zone player 200 is not receiving any audio sources for playback.

Figure 2C:
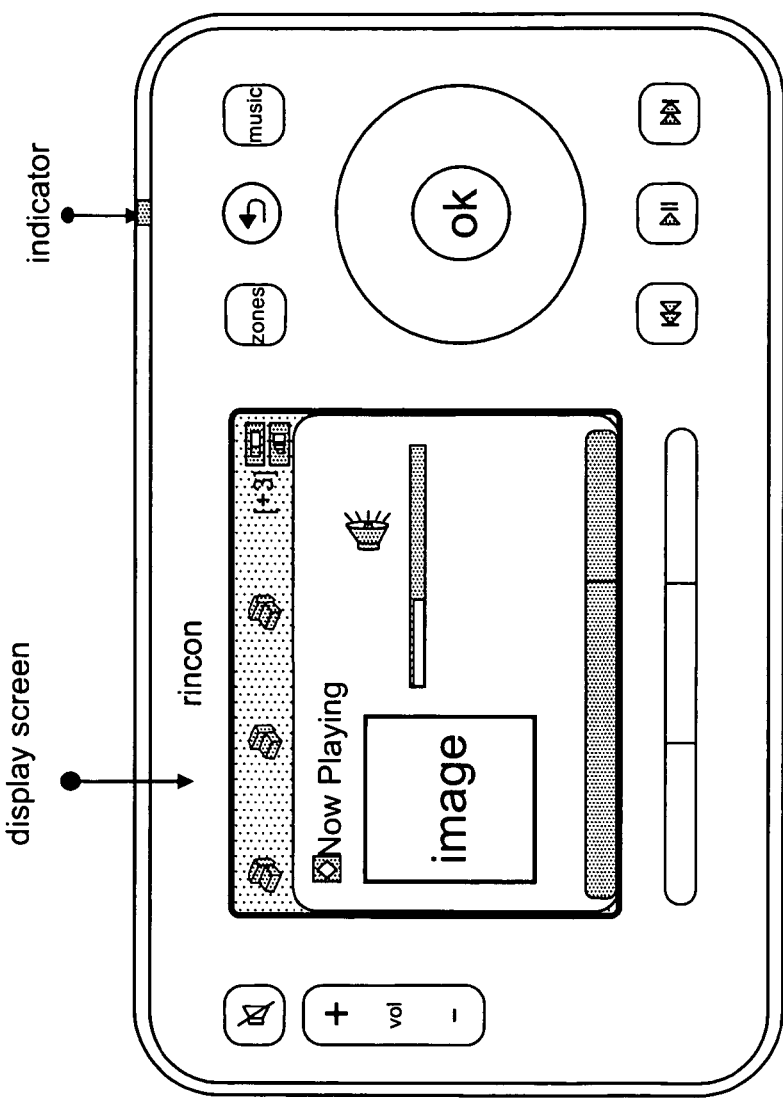
FIG. 2C shows a remote controller that may be used to control one of the zone players in a distributed audio system.

The RF interface 214 provides wireless means for the zone player 200 to communicate with a controller, preferably a portable. An example of the controller 240 is shown in FIG. 2C. According to one embodiment, the wireless means is based on an industry standard (e.g., infrared, radio, wireless standard 802.11b or 802.11g). The controller 240 may be used to facilitate a selection of a plurality of audio sources available on the network, controlling operation of the zone player 200 through the RF interface 214. When a particular audio source is being played in the zone player 200, a picture, if there is any, associated with the audio source may be transmitted from the zone player 200 to the controller 240. As shown in FIG. 2C, many operations of the zone player 200 can be remotely controlled via the RF interface 214.

Figure 3A:
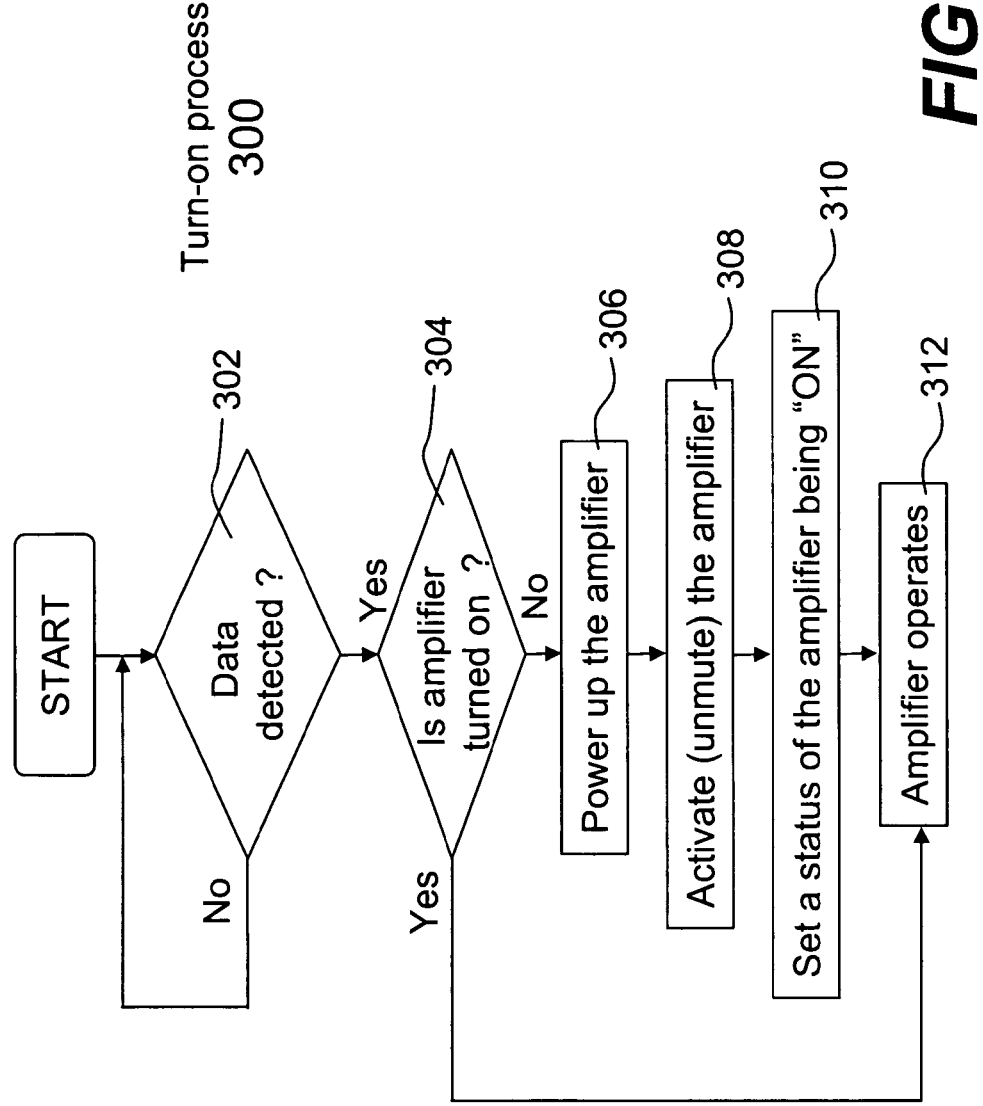
FIG. 3A shows a flowchart or process of powering on an amplifier according to one embodiment of the present invention.
Figure 3B:
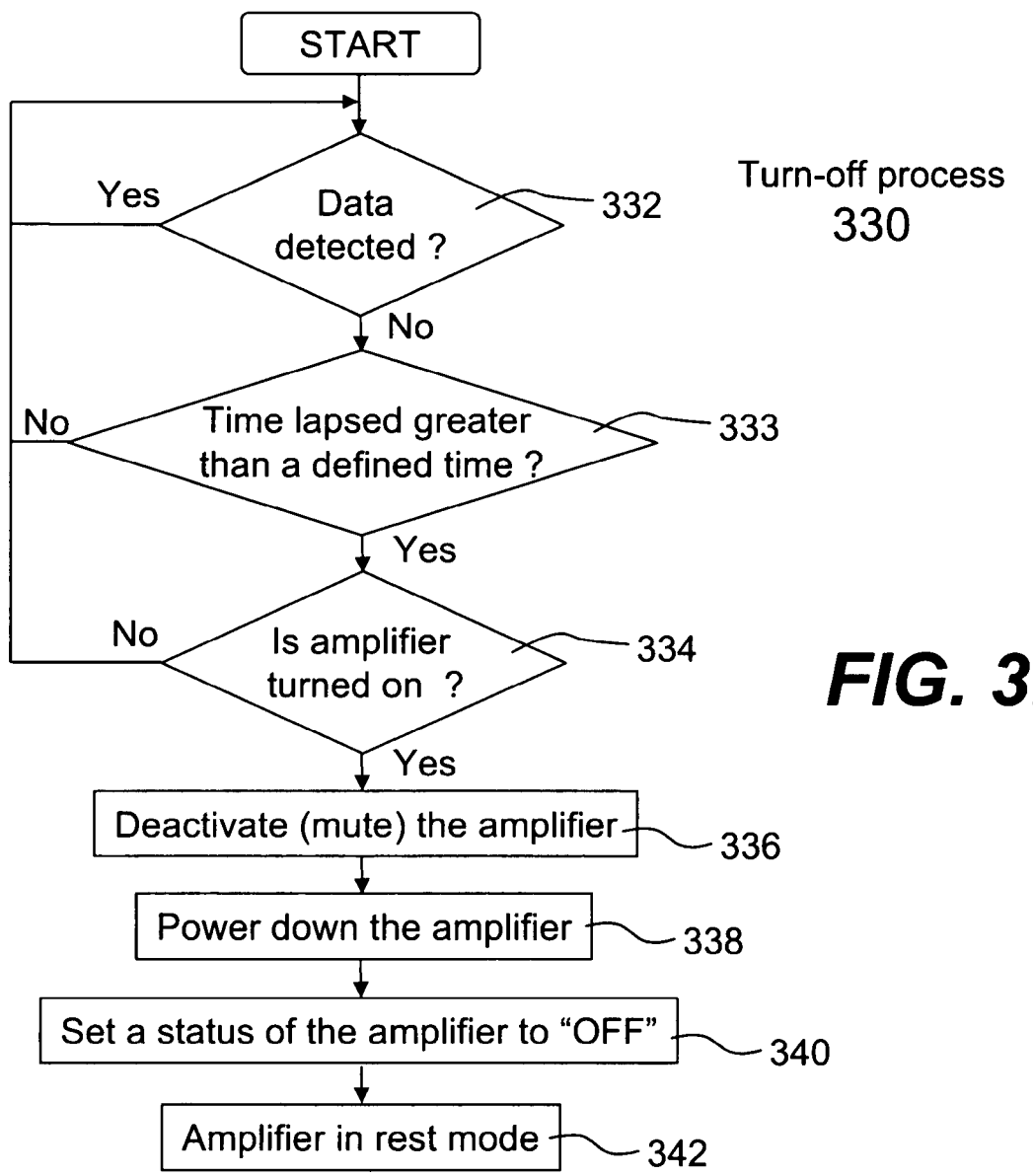
FIG. 3B shows a flowchart or process of powering down an amplifier according to one embodiment of the present invention.

FIG. 3A and FIG. 3B show respectively a flowchart or process 300 and 330 of a module implementing one embodiment of the present invention. The process 300 and 330, which is preferably understood in conjunction with the previous figures, may be implemented in software, hardware, or a combination of both. According to one embodiment, the module is embedded in a zone player (e.g., in the memory 206 in FIG. 2A) and can be executed to control the automatic shutdown of the audio amplifier in the zone player or associated with the zone player.

The process 300 of FIG. 3A implements an automatic turn-on (i.e., power up) capability. At 302, the process 300 detects if there is any audio source received. Depending on implementation, such detection may be implemented in a few places including the network or within the zone player. According to one embodiment, the module is configured to detect whether there is any data packets (e.g., part of the audio stream) in the network interface or other layers thereof. When no data flow is detected, the process 300 stays where it is at 302, namely, no action would be taken. When a data flow is detected, the process 300 moves onto 304.

It should be noted that the criteria of detecting the presence of data may vary depending on an exact implementation of the distributed digital audio system. In one embodiment, the zone player may be configured to receive data other than the audio data, where the audio data represents the audio source and the data other than the audio data may include commands or control information. Accordingly, a data packet may be analyzed to determine whether it represents part of an audio source. If the data packet is other than the audio data, the process 300 stays where it is at 302. The process 300 moves onto 304 only when one or more audio data packets are detected.

At 304, the status of the amplifier is determined. The amplifier may be already powered on and is operating, in which case the process 300 does nothing by going to 312. This happens usually in the middle of playing back a piece of music or in an interim (i.e., a temporary lapse) that happens, for example, when a new audio source is selected or to be started after a current one is just finished or jumping ahead of a few tracks in an audio source. In another case, however, the amplifier has been powered off and now needs to be turned back on to facilitate the playback of a received audio source. The process 300 now goes to 306 to power up the amplifier.

To avoid a sudden noise coming out from speakers when the amplifier is tuned on or off, the control of the amplifier is performed in accordance with a hysteresis, wherein the hysteresis, being lagging of an effect behind its cause, protects the amplifiers and makes the powering-down or powering-up procedure unnoticeable to a user. In other words, the hysteresis mutes or smoothes out possible noises or frequency as a result of the amplifier being "ON" from "OFF" or being "OFF" from "ON".

In one embodiment, the amplifier is always put into mute mode first when powered off. The mute mode can be realized in several ways that are known to those skilled in the art. For example, a connection from the amplifier to the speakers can be electronically disconnected. Hence, a preferable sequence of turning on an amplifier is to power on the amplifier first and then unmute or activate the amplifier. Accordingly, after the amplifier is powered on at 306, the process 300 moves to 308 to activate the amplifier.

In one embodiment, to control the operation of the amplifier precisely, one or more parameters about the status of the amplifier are used. The parameters may be referred to when the status of the amplifier is determined. At 310, the status of the amplifier is set to be "ON". The process 300 then goes to 312 where the amplifier operates in working mode, namely amplifying processed analog audio signals to drive speakers.

On the other end, the process 330 of FIG. 3B implements an automatic turn-off (i.e., power down). At 332, the process 330 detects if there is any audio source received. As described before, depending on implementation, such detection may be implemented in a few places including the network or within the zone player. According to one embodiment, the module is configured to detect whether there is any data packets (e.g., part of the audio stream) in the network interface or other layers thereof. When a data flow is detected, the process 330 stays where it is at 332, namely, no action would be taken. When no data flow is detected, the process 330 moves onto 333. There are certain situations in which no (audio) data flow can be detected, for example, during two separate songs. To ensure a proper shut-down process, at 333, a time lapsed for no data flow is measured. In one embodiment, the time is compared to a predetermined time, for example, 3 seconds, if the time is shorter than the predetermined time, namely before the predetermined time is lapsed, the process 330 goes back to 332 to continue the detection of the data flow. When the time is longer than the predetermined time, the process 330 moves onto 334.

According to one embodiment, to avoid powering the amplifier down during an interim (e.g., switching from one music to another, browsing a collection of songs), the time to determine whether the amplifier shall be powered down is implemented intelligently. For example, using the predetermined time as a base or a reference point, historical data on the durations between two consecutive pieces of music beyond the predetermined time is collected. Accordingly, an appropriate time can thus be derived from the data. As the process 300 as well as 330 can be implemented in software, various algorithms to determine such appropriate time are known to those skilled in the art and can be adopted relatively easy in the software implementation. It may be appreciated by now that the current invention provides the flexibility to determine how to control the amplifier, while the prior art shutdown systems obviously lack such control flexibility and must be equipped with additional circuitry.

It should be noted that the data flow herein pertain to an audio source. In one embodiment, the zone player may be configured to receive data other than the audio data, where the audio data represents the audio source and the data other than the audio data may include commands or control information). Accordingly, a data packet may be analyzed to determine whether it represents part of an audio source that is selected for playback. If the data packet is indeed the audio data, the process 330 stays where it is at 332. The process 330 moves onto 334 only when no audio data is detected.

At 334, the status of the amplifier is checked. If the status of the amplifier shows that it is already off, there is no further action needed. If the status of the amplifier shows that the amplifier has been "ON", the process 330 goes to 336 to first mute the amplifier and then power down the amplifier at 338. After the amplifier is powered down or the status of the amplifier has changed, the process 330 goes to 340 to update the status of the amplifier by resetting one or more parameters representing the status thereof to "OFF" at 340. Consequently, the amplifier goes to rest mode at 342.

Figure 4:
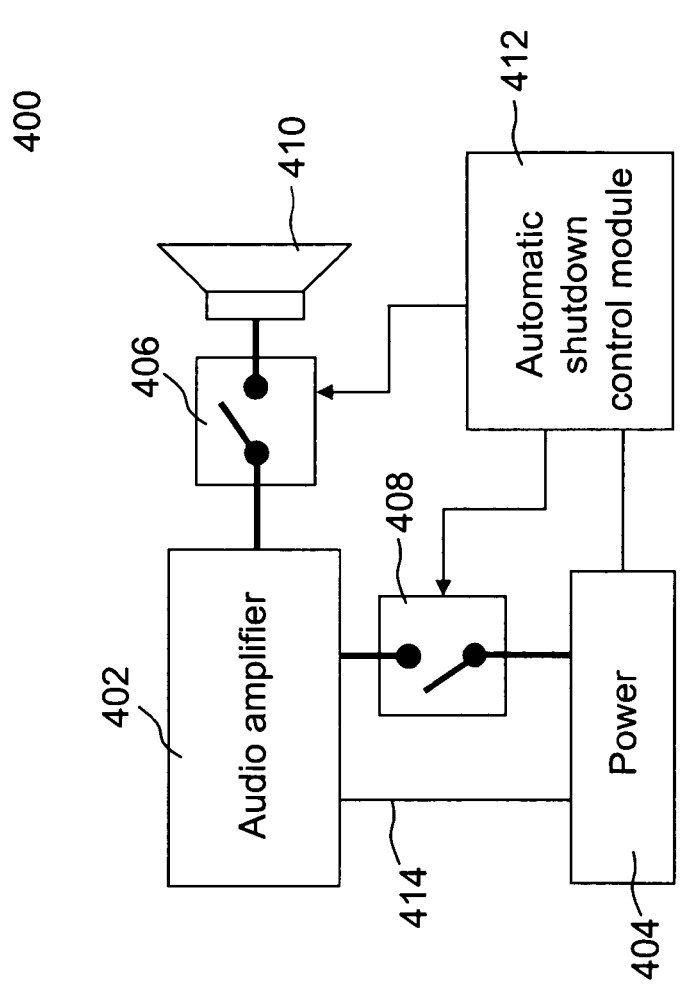
FIG. 4 shows an exemplary implementation of controlling an audio amplifier.

Referring now to FIG. 4, there shows an exemplary implementation 400 of controlling an audio amplifier 402. The automatic shutdown control module 412 operates in response to the detection of the audio data packets. At least two electronic connections 406 and 408 are controlled by the automatic shutdown control module 412. It is understood by those skilled in the art that the electronic connections 406 and 408 are not necessarily switches. Functionally, signals from the audio amplifier to speakers 410, power from a power supply 404 to the audio amplifier 402 or vice versa are controlled by the automatic shutdown control module 412.

In one embodiment, there is a small amount of power supplied to the audio amplifier 402 via an uncontrolled electronic connection 414 to keep a portion of the audio amplifier 402 to operate or to react to an instruction for the status of the audio amplifier to change. In operation, when the audio amplifier 402 is powered down, the audio amplifier 402 is to be deactivated or muted first and then powered down. This may be achieved by disconnecting the electronic connection 406 or preventing any signal from going to the speakers 410, and followed by disconnecting the electronic connection 408. Likewise, when the audio amplifier 402 is powered up to operate in working mode, the audio amplifier 402 is powered up and then activated. This may be achieved by restoring the electronic connection 408 and followed by restoring the electronic connection 406.

The present invention can be implemented in many ways, each of which may yield one or more of the following benefits, advantages or features. First, the control of an audio amplifier is based on a data flow of an audio source. The audio source is retrieved and comes from a network that has other data traffics. The present invention uses data traffic pertaining only to the data of the audio source to control the audio amplifier. Second, a flexible mechanism in terms of time of the absence of an audio data flow is provided, which could be hardly realized in a prior art system involving hardware. Third, the software-based implementation of controlling one or more amplifiers makes it possible to determine an appropriate define time, with a more sophisticated algorithm, to power down or up the amplifiers. In reality, it is desirable to control the amplifiers intelligently so as to achieve a longer operating lifespan of the amplifiers and save more power. Other benefits, advantages or features can be appreciated by those skilled in the art given the detailed description herein.

While the present invention has been described with reference to specific embodiments, the description is illustrative of the invention and is not to be construed as limiting the invention. Various modifications to the present invention can be made to the preferred embodiments by those skilled in the art without departing from the true spirit and scope of the invention as defined by the appended claim. For example, the present invention may also be applied to other forms of amplifiers that operate on signals from digital sources. One application is pertains to digital video, in which a visual amplifier (e.g., a display) consumes most of the power. Evidently, the present invention can be readily applied to prolong the operating lifespan of the amplifier as well as save substantially the power. Accordingly, the scope of the present invention is defined by the appended claims rather than the forgoing description of embodiments.

The invention claimed is:

1. A first playback device comprising an amplifier, wherein the first playback device is configured to, after the first playback device has determined that a defined time has passed since receiving a packet addressed to the first playback device and comprising audio data, transition the first playback device from (i) operating in a first power mode where the amplifier consumes a first amount of power to (ii) operating in a second power mode where the amplifier consumes a second amount of power that is less than the first amount of power.

2. The first playback device of claim 1, wherein the first playback device is further configured to, while operating in the first power mode, mute one or more speakers associated with the first playback device before transitioning from (i) operating in the first power mode to (ii) operating in the second power mode.

3. The first playback device of claim 1, wherein the first playback device is further configured to, while operating in the second power mode, receive a packet relating to an audio source and addressed to the first playback device, and in response, transition the first playback device from (i) operating in the second power mode to (ii) operating in the first power mode.

4. The first playback device of claim 3, wherein the packet relating to the audio source and addressed to the first playback device comprises audio data.

5. The first playback device of claim 3, wherein the first playback device is further configured to, while operating in the second power mode, mute one or more speakers associated with the first playback device before transitioning from (i) operating in the second power mode to (ii) operating in the first power mode.

6. The first playback device of claim 1, wherein the second amount of power is greater than or equal to no power.

7. The first playback device of claim 1, wherein the packet addressed to the first playback device and comprising audio data comprises a packet received from a second playback device in communication with the first playback device via a local area network.

8. The first playback device of claim 1, wherein the packet addressed to the first playback device and comprising audio data comprises a packet received from a computing device in communication with the first playback device via a local area network.

9. The first playback device of claim 1, wherein the packet addressed to the first playback device and comprising audio data comprises a packet received via an Internet audio source.

10. The first playback device of claim 1, wherein the audio data comprises streaming audio data.

11. Tangible, non-transitory computer readable media comprising instructions encoded therein, wherein the instructions, when executed, cause a first playback device to perform functions comprising:
after the first playback device has determined that a defined time has passed since receiving a packet addressed to the first playback device and comprising audio data, transition the first playback device from (i) operating in a first power mode where an amplifier associated with the first playback device consumes a first amount of power to (ii) operating in a second power mode where the amplifier consumes a second amount of power that is less than the first amount of power.

12. The tangible, non-transitory computer-readable media of claim 11, wherein the functions further comprise:
while operating in the first power mode, mute one or more speakers associated with the first playback device before transitioning from (i) operating in the first power mode to (ii) operating in the second power mode.

13. The tangible, non-transitory computer-readable media of claim 11, wherein the functions further comprise:
while operating in the second power mode, receive a packet relating to an audio source and addressed to the first playback device, and in response, transition the first playback device from (i) operating in the second power mode to (ii) operating in the first power mode.

14. The tangible, non-transitory computer-readable media of claim 13, wherein the packet relating to the audio source and addressed to the first playback device comprises audio data.

15. The tangible, non-transitory computer-readable media of claim 13, wherein the functions further comprise:
while operating in the second power mode, mute one or more speakers associated with the first playback device before transitioning from (i) operating in the second power mode to (ii) operating in the first power mode.

16. The tangible, non-transitory computer-readable media of claim 11, wherein the second amount of power is greater than or equal to no power.

17. The tangible, non-transitory computer-readable media of claim 11, wherein the packet addressed to the first playback device and comprising audio data comprises a packet received from a second playback device in communication with the first playback device via a local area network.

18. The tangible, non-transitory computer-readable media of claim 11, wherein the packet addressed to the first playback device and comprising audio data comprises a packet received from a computing device in communication with the first playback device via a local area network.

19. The tangible, non-transitory computer-readable media of claim 11, wherein the packet addressed to the first playback device and comprising audio data comprises a packet received via an Internet audio source.

20. The tangible, non-transitory computer-readable media of claim 11, wherein the audio data comprises streaming audio data.

* * * * *